United States Patent
Shin et al.

(10) Patent No.: US 10,007,572 B2
(45) Date of Patent: Jun. 26, 2018

(54) MEMORY SYSTEM AND METHOD OF OPERATING THE MEMORY SYSTEM

(71) Applicants: Dong-Min Shin, Seoul (KR); Jun-Jin Kong, Yongin-si (KR); Beom-Kyu Shin, Seongnam-si (KR); Eun-Chu Oh, Hwaseong-si (KR); Pil-Sang Yoon, Hwaseong-si (KR)

(72) Inventors: Dong-Min Shin, Seoul (KR); Jun-Jin Kong, Yongin-si (KR); Beom-Kyu Shin, Seongnam-si (KR); Eun-Chu Oh, Hwaseong-si (KR); Pil-Sang Yoon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 229 days.

(21) Appl. No.: 15/001,012

(22) Filed: Jan. 19, 2016

(65) Prior Publication Data

US 2016/0217030 A1 Jul. 28, 2016

(30) Foreign Application Priority Data

Jan. 23, 2015 (KR) .................... 10-2015-0011293

(51) Int. Cl.
*G06F 11/08* (2006.01)
*H03M 13/11* (2006.01)
(Continued)

(52) U.S. Cl.
CPC ........ *G06F 11/085* (2013.01); *G06F 11/1012* (2013.01); *G06F 11/1048* (2013.01); *H03M 13/00* (2013.01); *H03M 13/1102* (2013.01); *H03M 13/1162* (2013.01); *H03M 13/1165* (2013.01); *H03M 13/1174* (2013.01); *H03M 13/1182* (2013.01); *H03M 13/255* (2013.01)

(58) Field of Classification Search
CPC .............. G06F 11/085; G06F 11/1012; G06F 11/1048; H03M 13/00; H03M 13/1102; H03M 13/1162; H03M 13/1165; H03M 13/1174; H03M 13/1182; H03M 13/255
USPC ....... 714/758, 755, 752, 773, 785, 786, 799, 714/800, 801, 804
See application file for complete search history.

(56) References Cited

U.S. PATENT DOCUMENTS

| 5,325,375 A | 6/1994 | Westberg |
| 6,978,343 B1 * | 12/2005 | Ichiriu .................. G11C 15/00 365/49.1 |

(Continued)

FOREIGN PATENT DOCUMENTS

| JP | 2012-174296 | 2/2011 |
| KR | 10-0555958 | 2/2006 |
| KR | 10-2008-0076613 A | 8/2008 |

*Primary Examiner* — John J Tabone, Jr.
(74) *Attorney, Agent, or Firm* — Volentine, Whitt & Francos, PLLC

(57) ABSTRACT

A method of operating a memory system includes receiving information data corresponding to a second program unit that is a part of a first program unit and a write request for the information data from a host; generating a codeword by performing error correction code (ECC) encoding on the received information data such that a partial parity bit corresponding to the information data among all parity bits of the codeword is updated; and providing a memory device with the generated codeword and a write command regarding the codeword.

20 Claims, 35 Drawing Sheets

(51) Int. Cl.
*G06F 11/10* (2006.01)
*H03M 13/25* (2006.01)
*H03M 13/00* (2006.01)

(56) References Cited

U.S. PATENT DOCUMENTS

| | | | |
|---|---|---|---|
| 7,188,295 B2 | 3/2007 | Van Dijk et al. | |
| 7,305,607 B2 | 12/2007 | Kang et al. | |
| 7,334,181 B2* | 2/2008 | Eroz | H03M 13/1137 714/758 |
| 7,590,914 B2* | 9/2009 | Kim | H03M 13/1105 714/752 |
| 7,617,433 B2* | 11/2009 | Lee | H03M 13/1137 714/752 |
| 7,747,929 B2* | 6/2010 | Kyung | H03M 13/116 714/758 |
| 7,814,393 B2* | 10/2010 | Kyung | H03M 13/635 714/758 |
| 7,844,877 B2* | 11/2010 | Litsyn | G06F 11/1068 714/752 |
| 8,055,977 B2 | 11/2011 | Ito | |
| 8,190,962 B1* | 5/2012 | Chen | H04L 1/005 714/752 |
| 8,271,850 B2* | 9/2012 | Efimov | H03M 13/1182 714/752 |
| 8,286,048 B1* | 10/2012 | Chen | H03M 13/1128 714/752 |
| 8,555,027 B2 | 10/2013 | Kimura et al. | |
| 8,645,795 B2 | 2/2014 | Ishihara et al. | |
| 8,707,148 B2 | 4/2014 | Lee et al. | |
| 8,819,528 B2 | 8/2014 | Murakami et al. | |
| 9,692,450 B2* | 6/2017 | Khalil | H03M 13/114 |
| 2004/0034828 A1* | 2/2004 | Hocevar | H03M 13/1114 714/800 |
| 2004/0054960 A1* | 3/2004 | Eroz | H03M 13/11 714/800 |
| 2005/0246617 A1* | 11/2005 | Kyung | H03M 13/116 714/801 |
| 2005/0283707 A1* | 12/2005 | Sharon | H03M 13/1137 714/758 |
| 2006/0005105 A1* | 1/2006 | Yoshida | H03M 13/1137 714/758 |
| 2006/0036925 A1* | 2/2006 | Kyung | H03M 13/1134 714/758 |
| 2006/0036926 A1* | 2/2006 | Hocevar | H03M 13/118 714/758 |
| 2006/0045197 A1* | 3/2006 | Ungerboeck | H03M 13/11 375/261 |
| 2006/0156206 A1* | 7/2006 | Shen | H03M 13/1148 714/784 |
| 2007/0081475 A1* | 4/2007 | Telado | H04L 1/0003 370/255 |
| 2007/0101246 A1* | 5/2007 | Kyung | H03M 13/116 714/804 |
| 2007/0162822 A1* | 7/2007 | Choi | H03M 13/116 714/758 |
| 2008/0052596 A1* | 2/2008 | Heinrich | H03M 13/1105 714/758 |
| 2009/0259783 A1* | 10/2009 | Solomon | G06F 15/7867 710/105 |
| 2010/0070825 A1* | 3/2010 | Efimov | H03M 13/1182 714/755 |
| 2010/0122140 A1* | 5/2010 | Shen | H03M 13/1148 714/752 |
| 2011/0093760 A1* | 4/2011 | Gong | H03M 13/1105 714/758 |
| 2011/0167315 A1* | 7/2011 | Kyung | H03M 13/1162 714/752 |

* cited by examiner

FIG. 9

$$H = \begin{bmatrix} 0 & 1 & 1 & 1 & 1 & 0 & 0 \\ 1 & 0 & 1 & 1 & 0 & 1 & 0 \\ 1 & 1 & 0 & 1 & 0 & 0 & 1 \end{bmatrix}$$
$$\underbrace{\phantom{0\ 1\ 1\ 1}}_{DR} \underbrace{\phantom{1\ 0\ 0}}_{PR}$$

FIG. 18

| Data1 | Data2 | Data3 | Parity 1 |
|-------|-------|-------|----------|
| Data4 | Data5 | Data6 | Parity 2 |
| Data7 | Data8 | Data9 | Parity 3 |
| Parity 4 | Parity 5 | Parity 6 | |

FIG. 19

| Data1 | Data2 | Data3 | Parity 1 |
|-------|-------|-------|----------|
| Data4 | Data5 | Data6 | Parity 2 |
| Data7 | Data8 | Data9 | Parity 3 |
| Parity 4 | Parity 5 | Parity 6 | |

MEMORY SYSTEM AND METHOD OF OPERATING THE MEMORY SYSTEM

CROSS-REFERENCE TO RELATED APPLICATION

This application claims the benefit of Korean Patent Application No. 10-2015-0011293, filed on Jan. 23, 2015, in the Korean Intellectual Property Office, the disclosure of which is incorporated herein in its entirety by reference.

BACKGROUND

The disclosure relates to a semiconductor device, and more particularly to, a memory system capable of performing a partial program and method of operating the memory system.

According to a demand for memory devices that have high capacity and low power consumption, research into next-generation memory devices that are non-volatile and need no refresh is being conducted. The next-generation memory devices are required to have a high integrity characteristic of dynamic random access memory (DRAM), a non-volatile characteristic of a flash memory, and a high speed characteristic of static RAM (SRAM). As the next-generation memory devices that meet the above-described requirements, phase change RAM (PRAM), a nano-floating gate memory (NFGM), polymer RAM (PoRAM), magnetic RAM (MRAM), ferroelectric RAM (FeRAM), and resistive RAM (RRAM) are highlighted.

SUMMARY

According to an aspect of the disclosure, there is provided a method of operating a memory system including receiving information data corresponding to a second program unit that is a part of a first program unit and a write request for the information data from a host; generating a codeword by performing error correction code (ECC) encoding on the received information data such that a partial parity bit corresponding to the information data among all parity bits of the codeword is updated; and providing a memory device with the generated codeword and a write command regarding the codeword.

According to another aspect of the disclosure, there is provided a method of operating a memory system including receiving information data corresponding to a second program unit that is a part of a first program unit and a write request for the information data from a host; generating a codeword by performing low density parity check (LDPC) encoding on the received information data by using a parity check matrix; and providing a memory device with the generated codeword and a write command regarding the codeword. The parity check matrix includes a data region divided into at least first through third data sets and a parity region divided into at least first and second parity sets. When the information data corresponds to the first data set, only a parity bit corresponding to the first parity set is updated, and when the information data corresponds to the second data set, only a parity bit corresponding to the second parity set is updated.

According to another aspect of the disclosure, there is provided a method of operating a memory system including receiving information data corresponding to a second program unit that is a part of a first program unit and a write request for the information data from a host; generating a codeword by performing low density parity check (LDPC) encoding on the received information data by using a parity check matrix such that a partial parity bit corresponding to the information data among all parity bits of the codeword is updated; providing a memory device with the generated codeword and a write command regarding the codeword; and writing the information data and the updated partial parity bit included in the codeword to a memory cell array included in the memory device.

According to another aspect of the disclosure, there is provided a memory system including a memory device including a memory cell array; and a memory controller configured to generate a codeword by performing ECC encoding on information data corresponding to a second program unit that is a part of a first program unit such that a partial parity bit corresponding to the information data among all parity bits of the codeword is updated, and provide the memory device with the generated codeword and a write command regarding the codeword.

According to another aspect of the disclosure, there is provided a method, executed by a memory controller, of operating a memory system. The method includes generating a first codeword comprising first and second information data and first and second parity data; programming the first codeword into memory cells of a nonvolatile memory; generating third parity data from third information data that is a revision of the second information data; and programming the third information data into one or more memory cells of the nonvolatile memory storing the second information data while programming the third parity data into one or more memory cells of the nonvolatile memory storing the second parity data, without programming a value into memory cells of the nonvolatile memory storing the first parity data.

BRIEF DESCRIPTION OF THE DRAWINGS

Exemplary embodiments of the disclosure will be more clearly understood from the following detailed description taken in conjunction with the accompanying drawings in which:

FIG. 9 illustrates an example of a parity check matrix of a low density parity check (LDPC) code;

FIG. 18 illustrates an example of an ECC structure used in the ECC processing unit of FIG. 17 according to an exemplary embodiment;

FIG. 19 illustrates an example of a partial program operation using the ECC structure of FIG. 18 according to an exemplary embodiment;

DETAILED DESCRIPTION OF THE EMBODIMENTS

Figure 1:
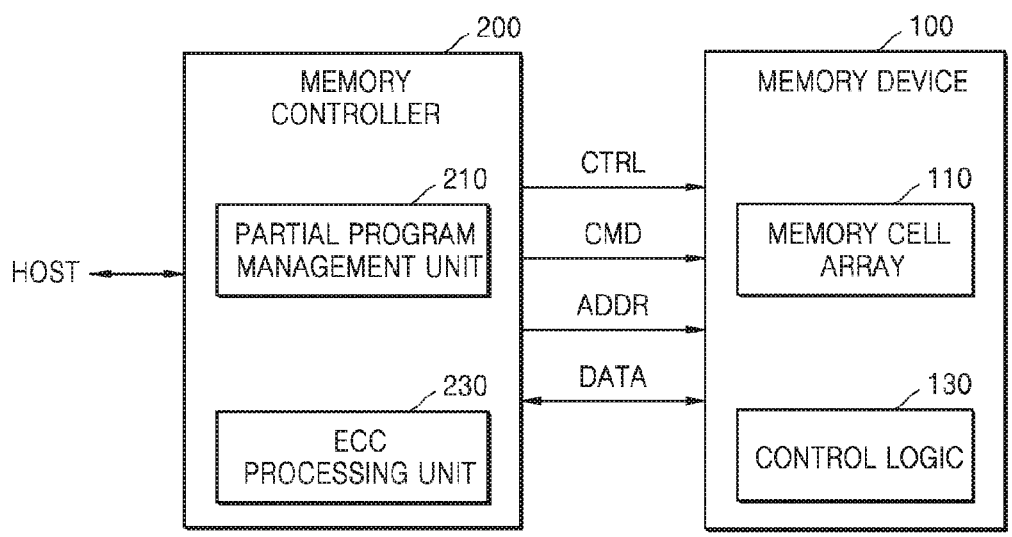
FIG. 1 is a block diagram of a memory system according to an exemplary embodiment.

The disclosure will now be described more fully with reference to the accompanying drawings, in which exemplary embodiments of the disclosure are shown. The disclosure may, however, be embodied in many different forms and should not be construed as being limited to the exemplary embodiments set forth herein; rather, these exemplary embodiments are provided so that this disclosure will be thorough and complete, and will fully convey the concept of the disclosure to those of ordinary skill in the art. It is to be appreciated that all changes, equivalents, and substitutes that do not depart from the spirit and technical scope of the disclosure are encompassed in the disclosure. Like reference numerals in the drawings denote like elements. In the drawings, the thicknesses of layers and regions are exaggerated for clarity.

The terms used in the present specification are merely used to describe particular exemplary embodiments, and are not intended to limit the disclosure. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that although the terms "first", "second", etc. may be used herein to describe various components, these components should not be limited by these terms. These components are only used to distinguish one component from another. For example, a first component may be referred to as a second component, and similarly, a second component may be referred to as a first component.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 according to an exemplary embodiment.

Referring to FIG. 1, the memory system 10 may include a memory device 100 and a memory controller 200. The memory device 100 may include a memory cell array 110 and a control logic 130. The memory controller 200 may include a partial program management unit 210 and an error correction code (ECC) processing unit 230.

In response to a write/read request from a host, the memory controller 200 may control the memory device 100 such that data stored in the memory device 100 is read or data is written to the memory device 100. In detail, the memory controller 200 may provide the memory device 100 with an address ADDR, a command CMD, and a control signal CTRL and thus may control a programming (or write) operation, a read operation, and an erase operation on the memory device 100. Data DATA that is to be written and read data DATA may be transmitted or received between the memory controller 200 and the memory device 100.

The memory cell array 110 may include a plurality of memory cells (not shown) that are disposed respectively in regions where a plurality of first signal lines and a plurality of second signal lines cross each other. According to an exemplary embodiment, the first signal lines may be word lines, and the second signal lines may be bit lines. According to another exemplary embodiment, the first signal lines may be bit lines, and the second signal lines may be word lines. The memory device 100 including the memory cell array 110 as described above may be referred to as a cross-point memory device.

According to the present exemplary embodiment, the plurality of memory cells may include resistive memory cells including a variable resistor device (not shown). For example, when the resistance of the variable resistor device that is formed of a phase change material (e.g., Ge—Sb—Te) is changed according to temperature, the memory device 100 may be phase change RAM (PRAM). As another example, when the variable resistor device is formed of an upper electrode, a lower electrode, and a transition metal oxide (complex metal oxide) therebetween, the memory device 100 may be resistive RAM (ReRAM). As another example, when the variable resistor device is formed of an upper electrode of a magnetic material, a lower electrode of a magnetic material, and a dielectric therebetween, the memory device 100 may be magnetic RAM (MRAM). Accordingly, the memory device 100 may be referred to as a resistive memory device, and the memory system 10 may be referred to as a resistive memory system.

According to an exemplary embodiment, each of the memory cells may be a single-level cell (SLC) that stores 1-bit data, and the memory cells may have two resistance distributions in accordance with stored data. According to another exemplary embodiment, each of the memory cells may be a multi-level cell (MLC) that stores 2-bit data, and the memory cells may have four resistance distributions in accordance with stored data. According to another exemplary embodiment, each of the memory cells may be a triple-level cell (TLC) that stores 3-bit data, and the memory cells may have eight resistance distributions in accordance with stored data. However, the disclosure is not limited thereto, and according to another exemplary embodiment, the memory cell array 110 may include an SLC and an MLC or a TLC.

The control logic 130 may control operations in the memory device 100 overall. In the present exemplary embodiment, the control logic 130 may control levels of voltages applied to the first and second signal lines connected to the memory device 100 or timings at which the voltages are applied. The voltages may include operating voltages applied to selected first and second signal lines and inhibit voltages applied to non-selected first and second signal lines.

The partial program management unit 210 may receive a partial write request from the host HOST and may control a partial program operation on the memory device 100 in response to the received partial write request. In the present exemplary embodiment, the partial program management unit 210 may receive information data corresponding to a second program unit that is a part of a first program unit and a partial write request for the information data from the host HOST. Hereinafter, the information data corresponding to the second program unit that is a part of the first program unit is referred to as partial information data.

In the present exemplary embodiment, the second program unit may be an arbitrary unit that is smaller than the first program unit. In an exemplary embodiment, the first program unit may be a page unit, and may correspond to a size of memory cells commonly connected to a same signal line (for example, a word line) in the memory cell array 110. In an exemplary embodiment, the second program unit may be a byte unit. In another exemplary embodiment, the second program unit may be a sector unit.

The ECC processing unit 230 may perform ECC encoding on the write data DATA and ECC decoding on the read data DATA. In more detail, the ECC processing unit 230 may perform ECC encoding on the information data received from the host HOST during the write operation, thereby generating a codeword and providing the codeword to the memory device 100. The ECC processing unit 230 may perform ECC decoding on the read data DATA, i.e. the codeword, received from the memory device 100 during the read operation, thereby generating information data and providing the information data to the host HOST. In this regard, a size of the codeword may correspond to the first program unit.

A NAND flash memory device may perform the write and read operations on a basis of a page unit. In more detail, the write and read operations may be simultaneously performed on memory cells commonly connected to a single word line in a memory cell array included in the NAND flash memory device. Thus, the NAND flash memory device may not perform the write and read operations, i.e. the partial program operation and the partial read operation, on basis of a unit that is smaller than the page unit.

Meanwhile, in the present exemplary embodiment, the memory device 100 may be a resistive memory device. In this case, the write and read operations may be performed on a basis of the unit that is smaller than the page unit. As described above, when ECC encoding used in a NAND flash memory device is performed on a resistive memory device supporting the partial program operation and the partial read operation, an entire parity of the codeword is updated despite a partial write operation. Thus, when the partial write operation is frequently performed, the speed of wearing out cells of a parity region may be much faster than the speed of wearing out cells of a data region in the memory cell array 110. Accordingly, a method of performing wear leveling on the memory device 10 or reducing the speed for wearing out the cells of the parity region is needed.

According to the present exemplary embodiment, the ECC processing unit 230 may generate the codeword in such a way that a partial parity bit corresponding to the information data received from the host HOST among all parity bits of the codeword may be updated. Thus, when the partial write request is received from the host HOST, the ECC processing unit 230 may generate the codeword in such a way that partial information data and a parity bit corresponding to the partial information data in the whole codeword may be only updated. Meanwhile, when a whole write request is received from the host HOST, the ECC processing unit 230 may generate the codeword in such a way that whole information data and all parity bits corresponding to the whole information data in the whole codeword may be only updated.

In the present exemplary embodiment, the ECC processing unit 230 may perform ECC encoding and ECC decoding. However, in another exemplary embodiment, the ECC processing unit 230 may perform ECC encoding and ECC decoding by using an algorithm such as a Reed-Solomon (RS) code, a Hamming code, a cyclic redundancy code (CRC), etc.

In the present exemplary embodiment, the ECC processing unit 230 may generate the codeword by using a parity check matrix including the data region divided into a plurality of data sets and the parity region divided into a plurality of parity sets. In this regard, the number of data sets may be greater than that of the parity sets. Accordingly, when the partial write request for the information data corresponding to one of the plurality of data sets is received, the ECC processing unit 230 may generate the codeword in such a way that partial parity bits among all parity bits may be updated by using the parity check matrix.

In the present exemplary embodiment, the data region of the parity check matrix may be divided into (L+1) data sets, the parity region thereof may be L data sets, and L is an integer equal to or greater than 2. When a data size is K bits, and a size of the codeword is N bits, a size of the parity check matrix is (N−K)×N. In this regard, a size of the data region is (N−K)×K, and a size of the parity region is (N−K)×(N−K).

In the present exemplary embodiment, a first data set among the (L+1) data sets may include at least one first zero matrix, and a first parity set among the L parity sets may include at least one second zero matrix corresponding to at least one row in which the at least one first zero matrix is disposed. Thus, when the partial write request for the information data corresponding to the first data set is received, the ECC processing unit 230 may generate a codeword in which only a parity bit corresponding to the first parity set among all the parity bits is updated. A detailed operation of the ECC processing unit 230 will be described later with reference to FIGS. 5 through 19.

Although not illustrated, the memory controller 200 may include random access memory (RAM), a processor, a host interface, and a memory interface. The RAM may be used as an operation memory of the processor, and the processor may control an operation of the memory controller 200. The host interface may include a protocol used to exchange data between the host HOST and the memory controller 200. For example, the memory controller 200 may communicate with an external host via at least one of various interface protocols such as universal serial bus (USB), multimedia card (MMC), peripheral component interconnection-express (PCI-E), advanced technology attachment (ATA), serial-ATA, parallel-ATA, small computer system interface (SCSI), enhanced small device interface (ESDI), and integrated drive electronics (IDE). The memory controller 200 will be described in detail with reference to FIG. 5 below.

The memory controller 200 and the memory device 100 may be integrated in one semiconductor device. For example, the memory controller 200 and the memory device 100 may be integrated in a semiconductor device and thus may configure a memory card. For example, the memory controller 200 and the memory device 100 may be integrated in a semiconductor device and thus may configure a PC card (a PCMCIA card), a compact flash card (CF card), a smart media card (SM/SMC), a memory stick, a multimedia card (MMC, RS-MMC, or MMCmicro), an SD card (SD, miniSD, or microSD), or a universal flash storage (UFS). As another example, the memory controller 200 and the memory device 100 may be integrated in a semiconductor device and thus may configure a Solid State Disk/Drive (SSD).

Figure 2:
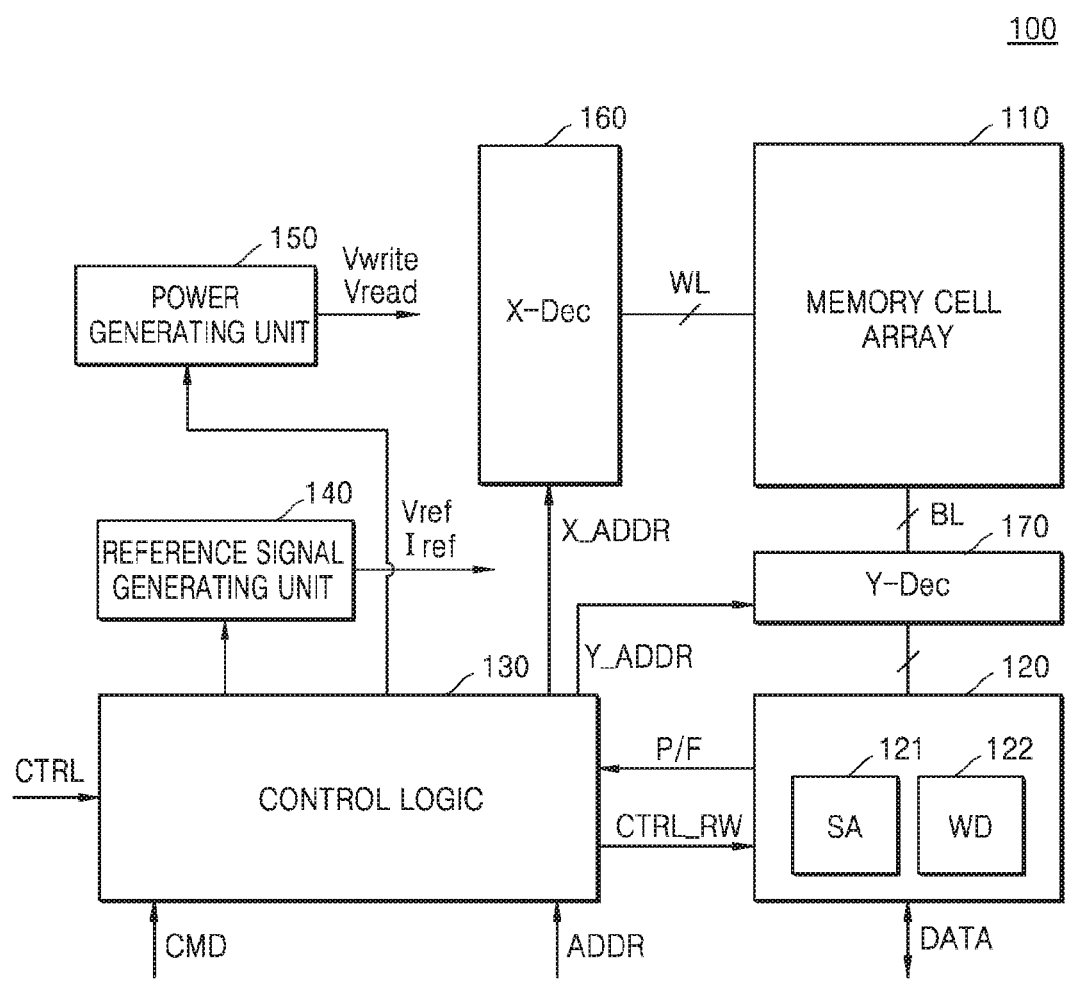
FIG. 2 is a detailed block diagram illustrating a memory device included in the memory system of FIG. 1.

FIG. 2 is a detailed block diagram illustrating the memory device 100 included in the memory system 10 of FIG. 1.

Referring to FIG. 2, the memory device 100 may include the memory cell array 110, a write/read circuit 120, the control logic 130, a reference signal generating unit 140, a power generating unit 150, a row decoder 160, and a column decoder 170. The write/read circuit 120 may include a sense amplifier 121 and a write driver 122. Hereinafter, elements included in the memory device 100 will be described in detail.

Memory cells included in the memory cell array 110 may be connected to a plurality of first signal lines and a plurality of second signal lines. According to an exemplary embodiment, the first signal lines may be word lines WL, and the second signal lines may be bit lines BL. Since various voltage signals or current signals are provided through the word lines WL and the bit lines BL, data may be written to or read from selected memory cells, and the data may be prevented from being written to or read from non-selected memory cells.

Meanwhile, the address ADDR to instruct a memory cell that is to be accessed may be received by being accompanied by the command CMD. The address ADDR may include a row address X_ADDR for selecting the word lines WL of the memory cell array 110 and a column address Y_ADDR for selecting the bit lines BL thereof. The address ADDR provided to the memory device 100 may correspond to a physical address (PA) converted in the memory system 10 in correspondence to a logical address (LA) from a host. The row decoder 160 may perform a word line selection operation in response to the row address X_ADDR. The column decoder 170 may perform a bit line selection operation in response to the column address Y_ADDR.

The write/read circuit 120 may be connected to the first signal lines and/or the second signal lines of the memory cell array 100 to write or read data to or from a memory cell (the write/read circuit 120 is connected to the bit lines BL in FIG. 2). According to an exemplary embodiment, the power generating unit 150 may generate a write voltage Vwrite used in a write operation and a read voltage Vread used in a read operation. The write voltage Vwrite may include a set voltage and a reset voltage as various voltages related to the write operation. The write voltage Vwrite and the read voltage Vread may be provided to the bit lines BL through the column decoder 170 or the word lines WL through the row decoder 160.

Meanwhile, the reference signal generating unit 140 may generate a reference voltage Vref and a reference current Iref as various reference signals related to a data read operation. For example, the sense amplifier 121 may be connected to a node (for example, a sensing node) of the bit line BL to sense data. A data value may be determined through an operation of comparing a voltage of the sensing node with the reference voltage Vref. Alternatively, when a current sensing method is used, the reference signal generating unit 140 may generate and provide the reference current Iref to the memory cell array 110. The data value may be determined through an operation of comparing a voltage of the sensing node, caused by the reference current Iref, with the reference voltage Vref.

The write/read circuit 120 may provide a pass/fail signal P/F as a result of determining the read data to the control logic 130. The control logic 130 may control write and read operations of the memory cell array 110 based on the pass/fail signal P/F.

The control logic 130 may output various controls signals CTRL_RW for writing or reading the data to or from the memory cell array 110 in response to the command CMD, the address ADDR, and the control signal CTRL that are received from the memory controller 200. Thus, the control logic 130 may generally control various operations performed in the memory device 100.

Referring to FIGS. 1 and 2, the memory controller 200 may provide a write command and write data to perform a partial write operation on the memory device 100. In the present exemplary embodiment, the write data may be a codeword in which partial information data and a parity bit corresponding to the partial information data are only updated. The control logic 130 may control the write/read circuit 120 to perform a pre-read operation on the memory cell array 110 in response to the received write command. Thereafter, the control logic 130 may compare the pre-read data with the write data to perform a write operation only on a cell in which the pre-read data and the write data are different from each other.

The write data, i.e. the codeword, in which the partial information data and the parity bit corresponding to the partial information data are only updated, and thus the pre-read data and the write data may be different from each other with respect to updated bits. Meanwhile, the write data, i.e. the codeword, in which remaining partial information data and remaining parity bits are not updated, and thus the pre-read data and the write data may be the same with respect to bits that are not updated. Accordingly, according to the present exemplary embodiment, the write operation may be performed only on a cell corresponding to the partial information data and the parity bit corresponding to the partial information data, and thus the speed of wearing out cells of a parity region may be reduced although a partial write operation is frequently performed.

Figure 3:
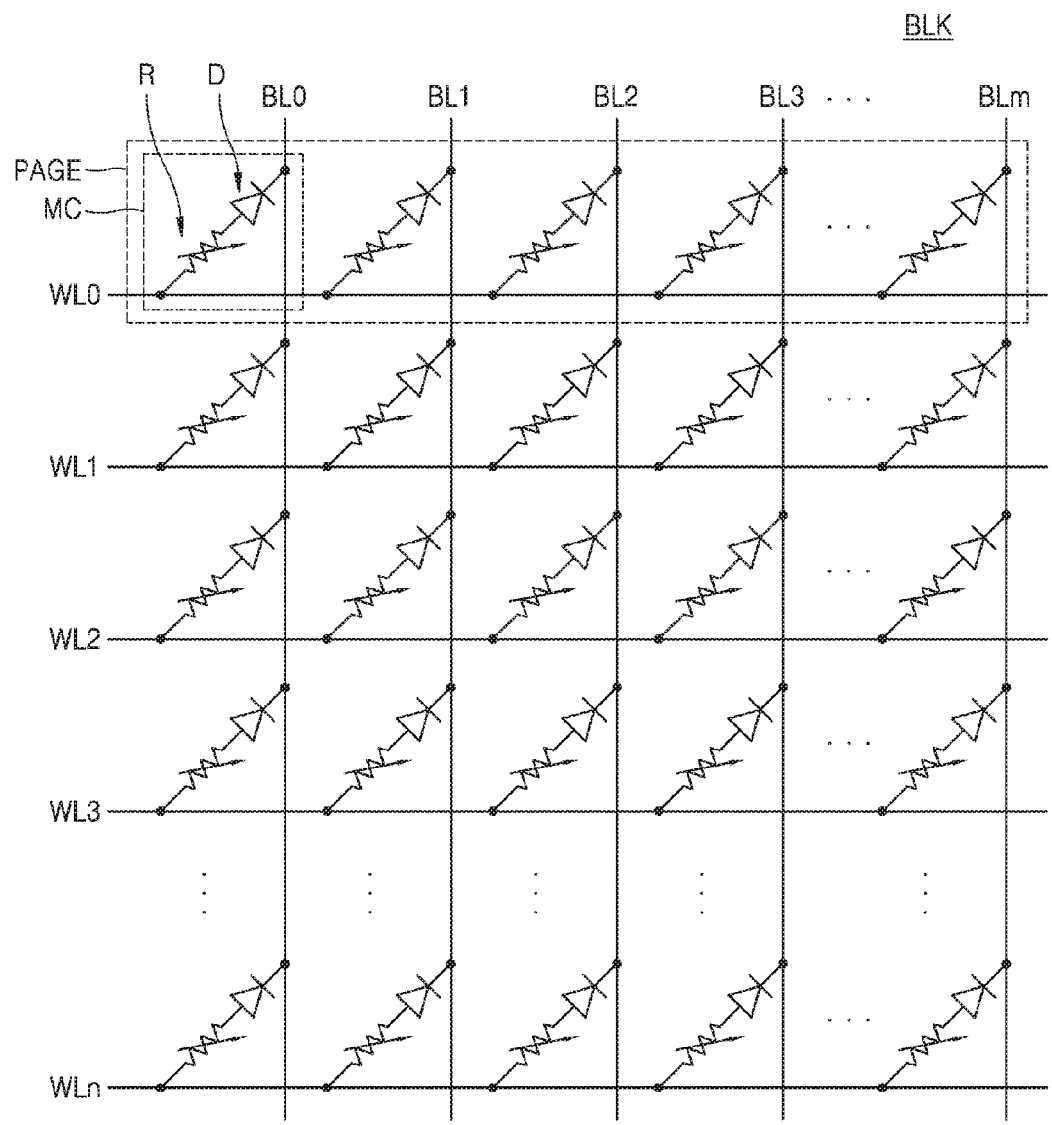
FIG. 3 is a circuit diagram of an example of a memory cell array of FIG. 2.

FIG. 3 is a circuit diagram of an example of the memory cell array 110 of FIG. 2. The memory cell array 110 may include a plurality of cell blocks. FIG. 3 may illustrate a single cell block BLK.

Referring to FIG. 3, the memory cell array 110 may include a plurality of word lines WL0 through WLn, a plurality of bit lines BL0 through BLm, and a plurality of memory cells MC. In this regard, the number of word lines WL, bit lines BL, and memory cells MC may be changed in various ways according to exemplary embodiments. The memory cells connected to a same word line may be defined as a page unit.

According to the present exemplary embodiment, each of the plurality of memory cells MC may include a variable resistor R and a selection device D. In this regard, the variable resistor R may be referred to as a variable resistor device or a variable resistance material, and the selection device D may be referred to as a switching device.

In an exemplary embodiment, the variable resistor R may be connected between one of the plurality of bit lines BL0 through BLm and the selection device D, and the selection device D may be connected between the variable resistor R and one of the plurality of word lines WL0 through WLn. However, the exemplary embodiments of the disclosure are not limited thereto, and the selection device D may be connected between one of the plurality of bit lines BL0 through BLm and the variable resistor R, and the variable resistor R may be connected between the selection device D and one of the plurality of word lines WL0 through WLn.

The variable resistor R may be changed to one of a plurality of resistance states by an applied electrical pulse. In an exemplary embodiment, the variable resistor R may include a phase change material whose crystal state is changed according to the amount of current. The phase change material may use various types of materials such as mixtures of two atoms GaSb, InSb, InSe, Sb2Te3, and GeTe, mixtures of three atoms GeSbTe, GaSeTe, InSbTe, SnSb2Te4, and InSbGe, and mixtures of four atoms AgInSbTe, (GeSn)SbTe, GeSb(SeTe), Te81Ge15Sb2S2, etc.

Such a phase change material may have an amorphous state in which resistance is relatively high and a crystal state in which resistance is relatively low. A phase of the phase change material may be changed according to the Joule's heat generated according to the amount of current. Such a phase change may be used to write data.

Meanwhile, in another exemplary embodiment, the variable resistor R may include, instead of the phase change material, perovskite compounds, a transition metal oxide, magnetic materials, ferromagnetic materials, or antiferromagnetic materials.

The selection device D may be connected between any one of the plurality of word lines WL0 through WLn and the variable resistor R, and may control a current supply to the variable resistor R according to a voltage applied to the connected word line and bit line. In an exemplary embodiment, the selection device D may be a PN or PIN junction diode having an anode that may be connected to the variable resistor R and a cathode that may be connected to one of the word lines WL0 through WLn. In this regard, if a voltage difference between the anode and the cathode is greater than a threshold voltage, the PN or PIN junction diode may be turned on to supply current to the variable resistor R.

Figure 4A:
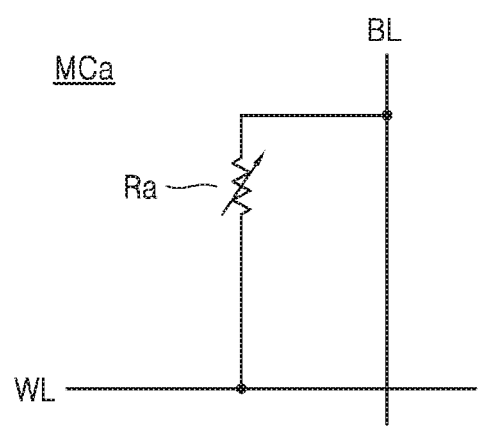
FIGS. 4A through 4C are circuit diagrams of modifications of a memory cell of FIG. 3.
Figure 4B:
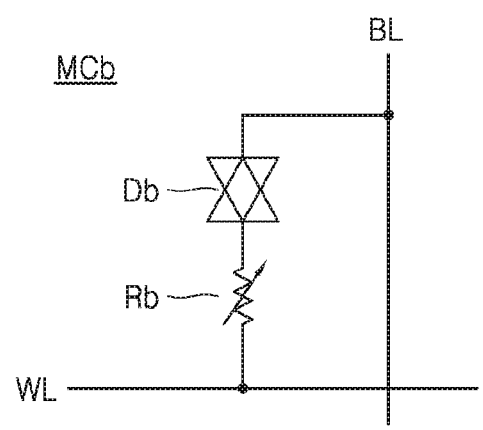
Figure 4C:
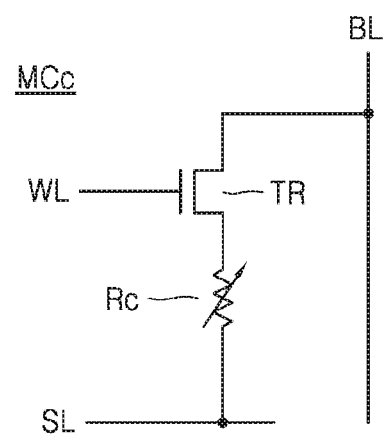

FIGS. 4A through 4C are circuit diagrams of modifications of the memory cell MC of FIG. 3.

Referring to FIG. 4A, a memory cell MCa may include a variable resistor Ra that may be connected between the bit line BL and the word line WL. The memory cell MCa may store data by voltages applied to the bit line BL and the word line WL.

Referring to FIG. 4B, a memory cell MCb may include a variable resistor Rb and a bi-directional diode Db. The variable resistor Rb may include a resistance material for storing data. The bi-directional diode Db may be connected to the variable resistor Rb and the bit line BL. The variable resistor Rb may be connected to the word line WL and the bi-directional diode Db. Positions of the bi-directional diode Db and the variable resistor Rb may be switched. Leakage current may be blocked from flowing in a non-selection resistor cell through the bi-directional diode Db.

Referring to FIG. 4C, a memory cell MCc may include a variable resistor Rc and a transistor TR. The transistor TR may be a selection device, i.e. a switching device, supplying or blocking current to the variable resistor Rc according to a voltage of the word line WL. In FIG. 4C, in addition to the word line WL, a source line SL may be further provided to adjust voltage levels of both ends of the variable resistor Rc. The transistor TR may be connected between the variable resistor Rc and the bit line BL. The variable resistor Rc may be connected to the source line SL and the transistor TR. Positions of the transistor TR and the variable resistor Rc may be switched. The memory cell MCc may be selected or may not be selected according to whether the transistor TR drive by the word line WL is turned on or off.

Figure 5:
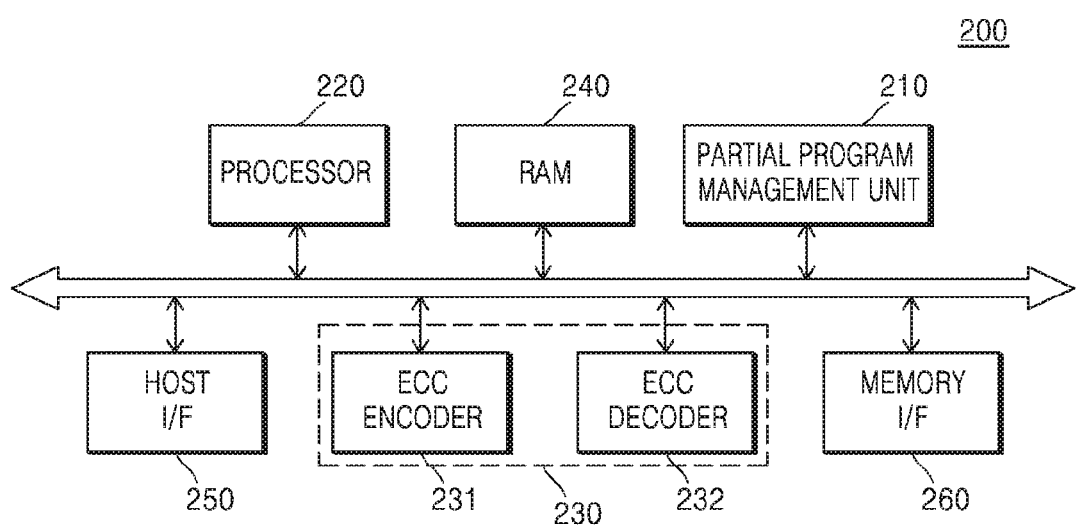
FIG. 5 is a detailed block diagram illustrating a memory controller included in the memory system of FIG. 1.

FIG. 5 is a detailed block diagram illustrating the memory controller 200 included in the memory system 10 of FIG. 1.

Referring to FIG. 5, the memory controller 200 may include the partial program management unit 210, a processor 220, the ECC processing unit 230, RAM 240, a host interface 250, and a memory interface 260. The ECC processing unit 230 may include an ECC encoder 231 and an ECC decoder 232.

The processor 220 may include a central processing unit or a microprocessor, and may control a general operation of the memory controller 200. In more detail, the processor 220 may be configured to drive firmware for controlling the memory controller 200. The firmware may be driven by being loaded in the RAM 240. The RAM 240 may be used as an operation memory, a cache memory, or a buffer memory of the processor 220.

The host interface 250 interfaces with a host to receive a request for a memory operation from the host. For example, the host interface 250 receives various requests such as data read and write operations from the host and generates various internal signals for the memory operation on the memory device 100 in response to the various received requests. For example, the memory controller 200 may be configured to communicate with the host through at least one of various interface protocols such as an advanced technology attachment (ATA), a serial-ATA (SATA), an external SATA (e-SATA), a small computer system interface (SCSI), a serial attached SCSI (SAS), a peripheral component interconnection (PCI), a PCI express (PCI-E), IEEE 1394, a universal serial bus (USB), a secure digital (SD) card, a multi media card (MMC), an embedded multimedia card (eMMC), a compact flash (CF) card interface, etc.

The memory interface 260 may provide an interface between the memory controller 200 and the memory device 100. For example, write data and read data may be transmitted and received to and from the memory device 100 through the memory interface 260. The memory interface 260 may provide a command and an address to the memory device 100, receive various pieces of information from the memory device 100, and provide the various pieces of information to internal components of the memory controller 200.

The partial program management unit 210 may control a partial program operation on the memory device 100 in response to a partial write request received from the host. Although the partial program management unit 210 is illustrated as a separate function block in the present exemplary embodiment, the partial program management unit 210 may be stored in the RAM 240 and driven by the processor 220.

Figure 6A:
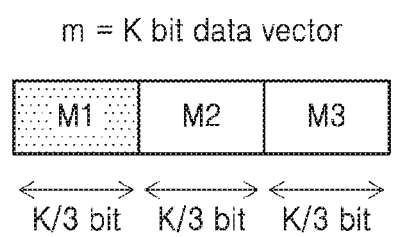
FIGS. 6A and 6B are diagrams for explaining a partial program operation according to an exemplary embodiment.
Figure 6B:
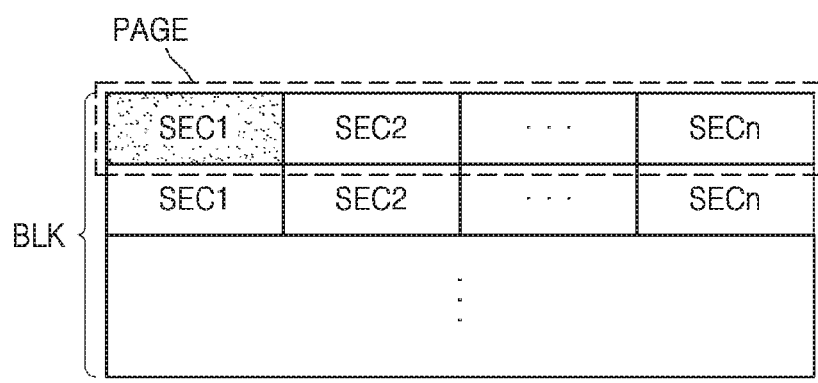

FIGS. 6A and 6B are diagrams for explaining a partial program operation according to an exemplary embodiment. Hereinafter, an operation of the memory controller 200 will be described in detail with reference to FIGS. 5, 6A, and 6B below.

Referring to FIG. 6A, in an exemplary embodiment, a length of data m corresponding to a first program unit may be K bits, and a host may provide a partial write request for partial information data, for example, first information data M1, corresponding to K/e bits corresponding to a second program unit that is a part of the first program unit. Thus, the memory controller 200 may receive only the first information data M1 from the host and may not receive remaining information data, i.e. second and third information data M2 and M3.

In the present exemplary embodiment, the partial program management unit 210 may receive the first information data M1 from the host and may control to perform a partial write operation on the first information data M1. In an exemplary embodiment, when the second and third information data M2 and M3 are stored in the RAM 240, the partial program management unit 210 may load and provide the second and third information data M2 and M3 from the RAM 240 to the ECC encoder 231. In another exemplary embodiment, when the second and third information data M2 and M3 are not stored in the RAM 240, the partial program management unit 210 may read the second and third information data M2 and M3 from a memory device and provide the second and third information data M2 and M3 to the ECC encoder 231.

The ECC encoder 231 may generate a codeword by generating a parity bit through low density parity check (LDPC) encoding using a parity check matrix on the information data received from the host. In the present exemplary embodiment, the ECC encoder 231 may generate the codeword including the first through third information data M1, M2, and M3 and parity bits by performing systematic ECC encoding. However, the disclosure is not limited thereto. In another exemplary embodiment, the ECC encoder 231 may generate a codeword including encoding bits regarding the first through third information data M1, M2, and M3 and parity bits.

For example, when a write request for the first information data M1 is received from the host, the ECC encoder 231 may generate the codeword in such a way that a partial parity bit corresponding to the first information data M1 may be updated among all parity bits included in the codeword. Thus, the ECC encoder 231 may generate the codeword in such a way that parity bits corresponding to the second and third information data M2 and M3 may not be updated. Accordingly, the memory device may perform a write operation only on cells corresponding to the first information data M1 and a parity bit corresponding to the information data M1, and may not perform the write operation on cells corresponding to the second and third information data M2 and M3 and the parity bits corresponding to the second and third information data M2 and M3.

Referring to FIG. 6B, the memory cell array 110 may include the memory block BLK that may include a plurality of pages PAGE. In an exemplary embodiment, each page PAGE may be divided into n sectors SEC1 through SECn.

According to the present exemplary embodiment, the cells corresponding to the first information data M1 and the parity bit corresponding to the information data M1 may correspond to the first sector SEC1, and the cells corresponding to the second and third information data M2 and M3 and the parity bits corresponding to the second and third information data M2 and M3 may correspond to the second through nth sectors SEC2 through SECn. In this case, in one page PAGE, a write operation or an overwrite operation may be performed on the first sector SEC1, and may not be performed on the second through nth sectors SEC2 through SECn. Thus, when the partial program operation is performed on a resistive memory device, the speed of wearing out cells included in a parity region of a memory cell array may be reduced.

Meanwhile, the ECC decoder 232 may detect and correct an error bit from read data received from the memory device through LDPC decoding using the parity check matrix. As an example, the ECC decoder 232 may detect the error bit by comparing a parity bit generated and stored when programming data and a parity bit generated when reading the data, and may correct the error bit by performing a predetermined logical operation (for example, exclusive or (XOR)) on the detected error bit.

Figure 7:
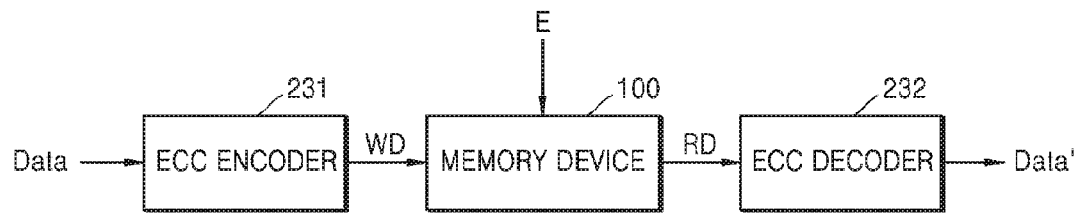
FIG. 7 illustrates an error correction code (ECC) encoding operation and an ECC decoding operation according to an exemplary embodiment.

FIG. 7 illustrates an ECC encoding operation and an ECC decoding operation according to an exemplary embodiment.

Referring to FIG. 7, if data and a write request are received from a host, the received data is encoded by the ECC encoder 231. In the present exemplary embodiment, the ECC encoder 231 may use a parity check matrix to perform LDPC encoding on the input data and generate a codeword. The codeword may be programmed in the memory device 100 as write data WD. In this regard, the write data WD may include parity bits for decoding.

Meanwhile, if a read request is received from the host, the data stored in the memory device 100 is read as read data RD. In this regard, the read data RD may include an error E that occurs due to various reasons. For example, the error E may occur due to a malfunction when the write data WD is programmed or a data loss when the write data WD is stored in the memory device 100. Alternatively, the error E may occur due to a malfunction during an operation of reading the read data RD.

The ECC decoder 232 may use the parity check matrix to perform LDPC decoding on the read data RD in order to remove the error E. In this regard, the parity check matrix may be the same as that used by the ECC encoder 231. A result of decoding performed by the ECC decoder 232 may be output as decoded data Data'.

Figure 8A:
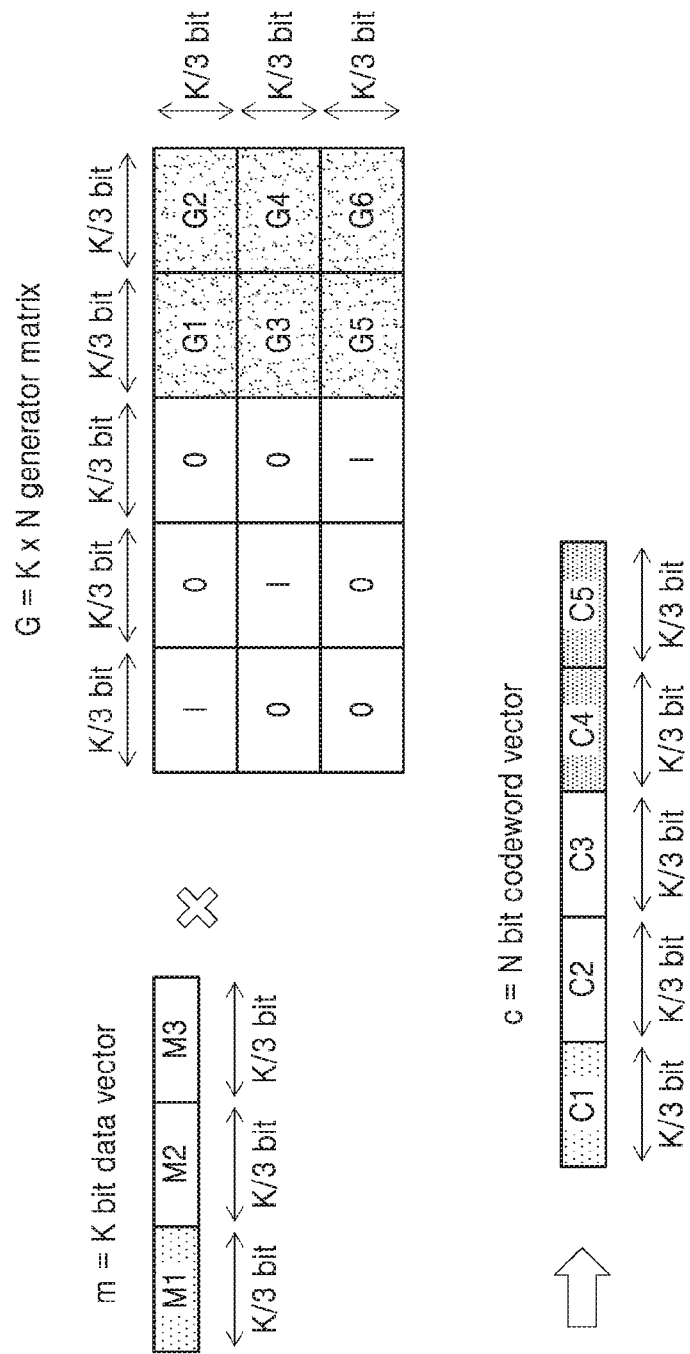
FIGS. 8A through 8C are diagrams for explaining operations of generating a codeword by using a general generator matrix for a partial program operation.
Figure 8B:
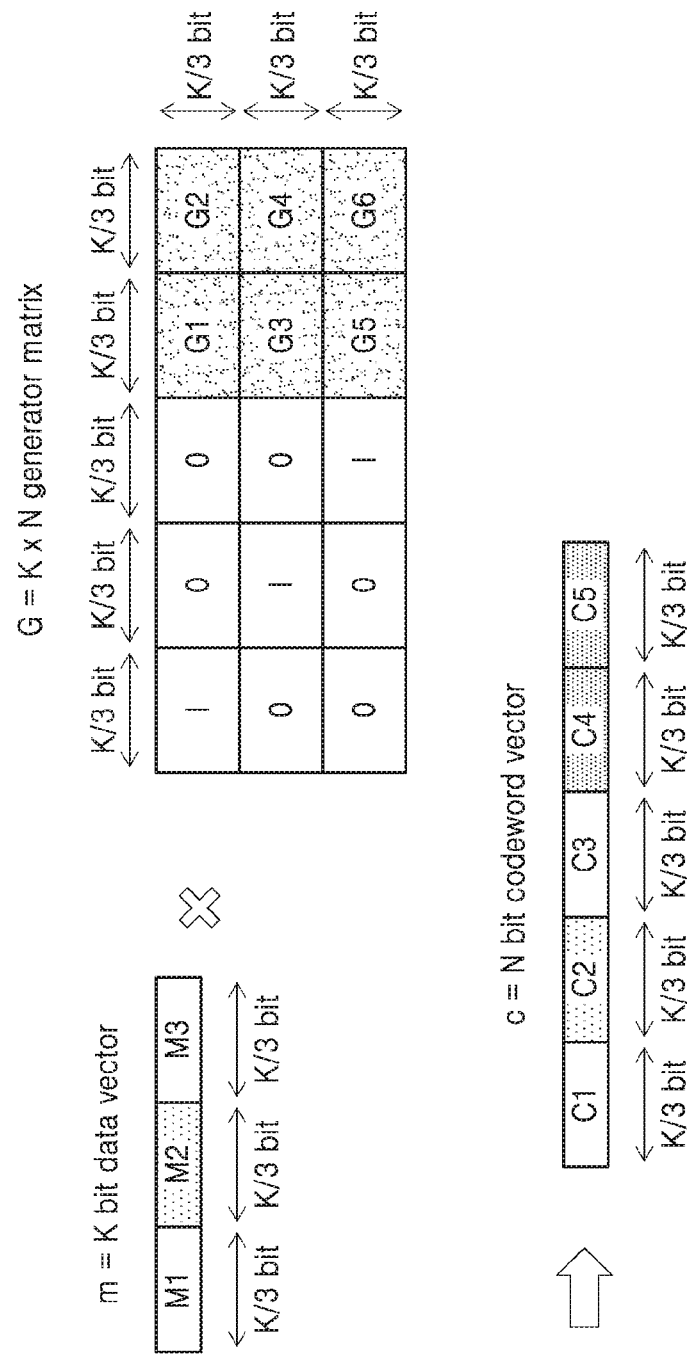
Figure 8C:
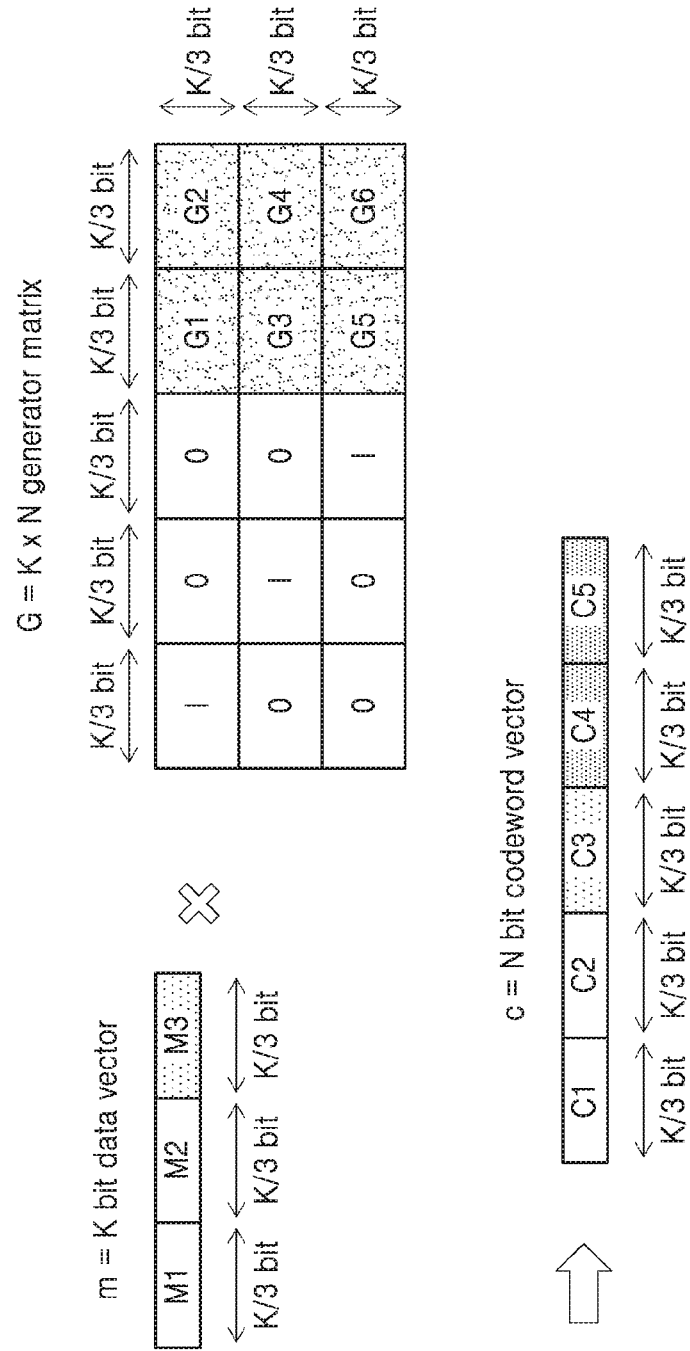

FIGS. 8A through 8C are diagrams for explaining operations of generating a codeword c by using a general generator matrix G for a partial program operation.

Referring to FIGS. 8A through 8C, when a size of the data m is K bits, and a size of the codeword c is N bits, a size of the generator matrix G is determined as K×N. The generator matrix G may be divided into an identity matrix having a size of K×K and a parity matrix having a size of K×(N−K), and thus the codeword c may have a systematic structure in which the data m is maintained as it is. If a data row vector of the K bits is expressed as $\underline{m}$, and a codeword row vector of the N bit is expressed as $\underline{c}$, a relationship between the data row vector m and the codeword row vector c is expressed as Equation 1 below.

$$\underline{c}=\underline{m}G \quad \text{[Equation 1]}$$

In the present exemplary embodiment, the data m may correspond to a first program unit, and a host may request a partial write operation for partial information data, for example, the first, second, or third information data M1, M2, or M3, corresponding to a second program unit that is a part of the first program unit.

FIG. 8A illustrates a codeword generation operation when a partial write request for the first information data M1 is received from the host. For example, the first information data M1 may be K/3 bits. In the codeword c generated through an arithmetic operation of the data m and the generator matrix G, a data bit C1 corresponding to the first information data M1 and both parity bits C4 and C5 may be updated, and data bits C2 and C3 corresponding to the second and third information data M2 and M3 may not be updated.

FIG. 8B illustrates the codeword generating operation when a partial write request for the second information data M2 is received from the host. For example, the second information data M2 may be the K/3 bits. In the codeword c generated through the arithmetic operation of the data m and the generator matrix G, the data bit C2 corresponding to the second information data M2 and the both parity bits C4 and C5 may be updated, and the data bits C1 and C3 corresponding to the first and third information data M1 and M3 may not be updated.

FIG. 8C illustrates the codeword generating operation when a partial write request for the third information data M3 is received from the host. For example, the third information data M3 may be the K/3 bits. In the codeword c generated through the arithmetic operation of the data m and the generator matrix G, the data bit C3 corresponding to the third information data M3 and the both parity bits C4 and C5 may be updated, and the data bits C1 and C2 corresponding to the first and second information data M1 and M2 may not be updated.

As described above, when the general generator matrix G is used to generate the codeword c, despite the partial program operation on a memory device, all parity bits are always updated. Accordingly, the number of write operations on cells included in a parity region is much greater than that of write operations on cells included in a data region in a memory cell array. Thus, the speed of wearing out the cells included in the parity region increases.

FIG. 9 illustrates an example of a parity check matrix H of an LDPC code.

Referring to FIG. 9, the parity check matrix H may be arranged in rows and columns, and may be divided into a data region DR and a parity region PR. When a size of the data m is K bits, and a size of the codeword c is N bits, the parity check matrix H may have a size of (N−K)×N and may have 0 or 1 as an element. In the example of FIG. 9, the size of the parity check matrix H is 3×7. If a codeword row vector of the N bit is expressed as c, a relationship between the parity check matrix H and the codeword row vector c is expressed as Equation 2 below.

$$H\underline{c}=\underline{0} \quad \text{[Equation 2]}$$

$\underline{0}$ is a zero vector having (N−K) as a length and only 0 as elements.

Meanwhile, a relationship between the parity check matrix H and the general generator matrix G is expressed as Equation 3 below.

$$GH^t=\underline{0} \quad \text{[Equation 3]}$$

$H^t$ is a transpose matrix of the parity check matrix H and $\underline{0}$ is a zero vector having only 0 as elements. The general generator matrix G may be calculated from the parity check matrix H by using Equation 3 above.

When the general generator matrix G includes an identity matrix as shown in FIGS. 8A through 8C above, the relationship between the parity check matrix H and the general generator matrix G is expressed as Equation 4 below.

$$G=[I_k \vdots P] \longleftrightarrow H=[-P^t \vdots I_{n-k}] \quad \text{[Equation 4]}$$

$I_k$ is the identity matrix corresponding to size k of data m, and P is a parity matrix.

Figure 10A:
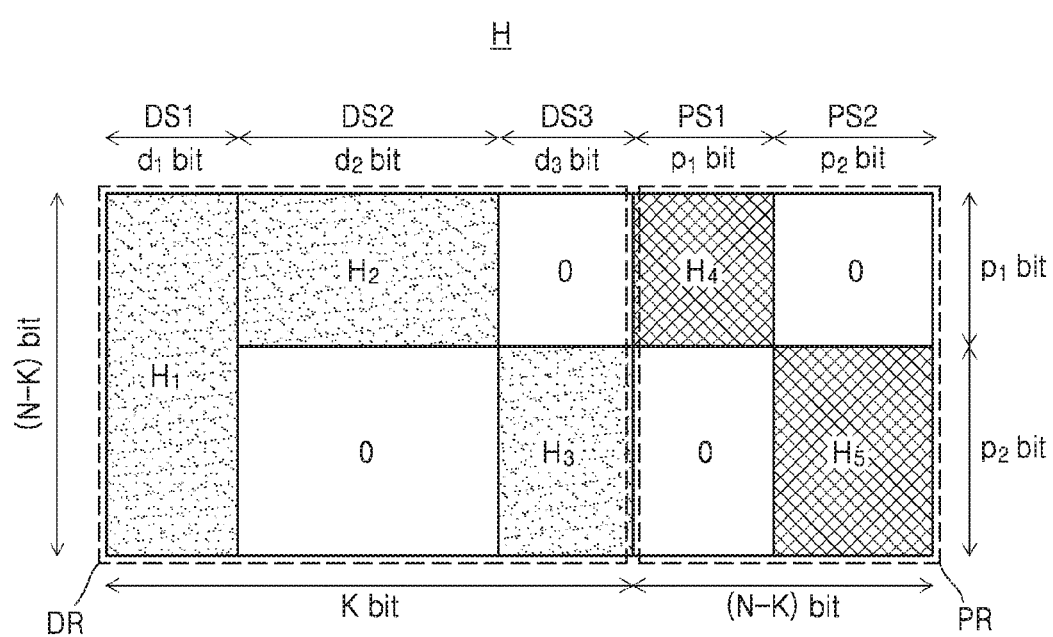
FIGS. 10A and 10B illustrate examples of a parity check matrix according to an exemplary embodiment.

FIG. 10A illustrates an example of the parity check matrix H according to an exemplary embodiment.

Referring to FIG. 10A, when a size of the data m is K bits, and a size of the codeword c is N bits, a size of the parity check matrix H is (N−K)×N, a size of the data region DR is (N−K)×K, and a size of the parity region PR is (N−K)×(N−K). The parity check matrix H may include the data region DR and the parity region PR. The data region DR may be divided into A data sets. The parity region PR may be divided into B parity sets. A and B are integers equal to or greater than 2. A is greater than B.

In the present exemplary embodiment, A may correspond to B+1, and the B data sets may respectively correspond to the B parity sets. In more detail, when a partial write request for information data corresponding to one of the B data sets is received, only a parity bit corresponding to one of the B parity sets may be updated. In this regard, when the partial write request for information data corresponding to remaining one data set is received, all parity bits may be updated.

However, the disclosure is not limited thereto. A and B may be selected in various ways according to embodiments. In more detail, A may be determined to correspond to a second program unit or a multiplication of the second program unit. B may be selected as an arbitrary integer equal to or greater than 2. Hereinafter, an embodiment in which A is 3 and B is 2 will be described in detail below.

In the present exemplary embodiment, the parity check matrix H may be divided into 5 sets. In more detail, the data region DR may be divided into first through third data sets DS1, DS2, and DS3, and the parity region PR may be divided into first and second sets PS1 and PS2. A column size of the first data set DS1 is $d_1$. A column size of the second data set DS2 is $d_2$. A column size of the third data set DS3 is $d_3$. A sum of $d_1$, $d_2$, and $d_3$ may correspond to K (i.e., $d_1+d_2+d_3=K$). Meanwhile, a column size of the first parity set PS1 is $p_1$. A column size of the second parity set PS2 is $p_2$. A sum of $p_1$ and $p_2$ may correspond to (N−K) (i.e., $p_1+p_2=N-K$).

In the present exemplary embodiment, elements included in $d_1$ columns included in the first data set DS1 may not be restricted. Thus, the elements included in the first data set DS1 may be generated by using a method of generating a parity check matrix for usual LDPC coding.

Meanwhile, in the present exemplary embodiment, in $d_2$ columns included in the second data set DS2, elements included in lower $p_2$ rows are always 0, and in $d_3$ columns included in the third data set DS3, elements included in upper $p_1$ rows are always 0. Likewise, in $p_1$ columns included in the first parity set PS1, elements included in lower $p_2$ rows are always 0, and in $p_2$ columns included in the second parity set PS2, elements included in upper $p_1$ rows are always 0.

As described above, according to the present exemplary embodiment, the parity check matrix H may be divided into a plurality of sub-blocks or sub-matrixes $H_1$ through $H_5$ and a plurality of zero-blocks or zero-matrixes 0. In this regard, the sub-matrixes $H_1$ through $H_5$ may include elements other than 0, whereas the zero-matrixes unconditionally include only elements of 0. Thus, the sub-matrixes $H_1$ through $H_5$ may be referred to as non-zero matrixes.

In the present exemplary embodiment, the first data set DS1 may include the first sub-matrix $H_1$, the second data set DS2 may include the second sub-matrix $H_2$ and the zero-matrix 0, and the third data set DS3 may include the zero-matrix 0 and the third sub-matrix $H_3$. The first parity set PS1 may include the fourth sub-matrix $H_4$ and the zero-matrix 0, and the second parity set PS2 may include the zero matrix 0 and the fifth sub-matrix $H_5$.

In the present exemplary embodiment, since the elements included in the lower $p_2$ rows of the first parity set PS1 are always 0, when there is a partial write request for partial information data corresponding to the third data set DS3, a parity bit corresponding to the first parity set PS1 is not updated. Likewise, since the elements included in the upper $p_1$ rows of the second parity set PS2 are always 0, when there is the partial write request for partial information data corresponding to the second data set DS2, a parity bit corresponding to the second parity set PS2 is not updated.

However, the disclosure is not limited thereto. In another exemplary embodiment, the second and third data sets DS2 and DS3 may include two or more sub-matrixes or two or more zero-matrixes. Likewise, the first and second parity sets PS1 and PS2 may include two or more sub-matrixes or two or more zero-matrixes. In this case, locations of the two or more sub-matrixes or the two or more zero-matrixes included in the second data set DS2 in a row direction may correspond to locations of the two or more sub-matrixes or the two or more zero-matrixes included in the first parity set PS1 in the row direction. Likewise, locations of the two or more sub-matrixes or the two or more zero-matrixes included in the third data set DS3 in a row direction may correspond to locations of the two or more sub-matrixes or the two or more zero-matrixes included in the second parity set PS2 in the row direction.

Figure 10B:
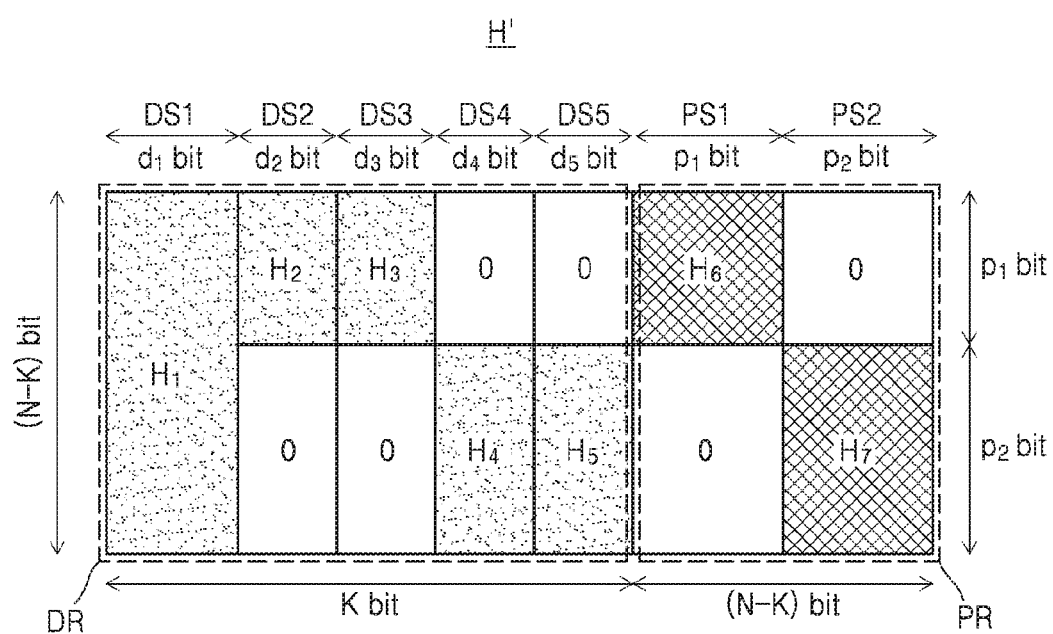

FIG. 10B illustrates another example of a parity check matrix H' according to an exemplary embodiment.

Referring to FIG. 10B, when a size of the data m is K bits, and a size of the codeword c is N bits, a size of the parity check matrix H' is (N−K)×N, a size of the data region DR is (N−K)×K, and a size of the parity region PR is (N−K)×(N−K). The parity check matrix H' may include the data region DR and the parity region PR. The data region DR may be divided into A data sets. The parity region PR may be divided into B parity sets. A and B are integers equal to or greater than 2. A is greater than B.

In the present exemplary embodiment, A may correspond to 2B+1, and the 2B data sets may respectively correspond to the B parity sets. In more detail, when a partial write request for information data corresponding to one of the 2B data sets is received, only a parity bit corresponding to one of the B parity sets may be updated. In this regard, when the partial write request for information data corresponding to remaining one data set is received, all parity bits may be updated.

However, the disclosure is not limited thereto. A and B may be selected in various ways according to embodiments.

In more detail, A may be determined to correspond to a second program unit or a multiplication of the second program unit. B may be selected as an arbitrary integer equal to or greater than 2. Hereinafter, an embodiment in which A is 5 and B is 2 will be described in detail below.

In the present exemplary embodiment, the parity check matrix H' may be divided into 7 sets. In more detail, the data region DR may be divided into the first through fifth data sets DS1 through DS5, and the parity region PR may be divided into the first and second sets PS1 and PS2. A column size of the first data set DS1 is $d_1$. A column size of the second data set DS2 is $d_2$. A column size of the third data set DS3 is $d_3$. A column size of the fourth data set DS4 is $d_4$. A column size of the fifth data set DS5 is $d_5$. A sum of $d_1$, $d_2$, $d_3$, $d_4$, and $d_5$ may correspond to K (i.e., $d_1+d_2+d_3+d_4+d_5=K$). Meanwhile, a column size of the first parity set PS1 is $p_1$. A column size of the second parity set PS2 is $p_2$. A sum of $p_1$ and $p_2$ may correspond to (N−K) (i.e., $p_1+p_2=N-K$).

In the present exemplary embodiment, elements included in $d_1$ columns included in the first data sets DS1 may not be restricted. Thus, the elements included in the first data sets DS1 may be generated by using a method of generating the parity check matrix H' for usual LDPC coding.

Meanwhile, in the present exemplary embodiment, in $d_2$ columns included in the second data set DS2, elements included in lower $p_2$ rows are always 0, in $d_3$ columns included in the third data set DS3, elements included in lower $p_2$ rows are always 0, in $d_3$ columns included in the fourth data set DS4, elements included in upper $p_1$ rows are always 0, and in $d_5$ columns included in the fifth data set DS5, elements included in upper $p_1$ rows are always 0. Likewise, in $p_1$ columns included in the first parity set PS1, elements included in lower $p_2$ rows are always 0, and in $p_2$ columns included in the second parity set PS2, elements included in upper $p_1$ rows are always 0.

As described above, according to the present exemplary embodiment, the parity check matrix H' may be divided into a plurality of sub-blocks or sub-matrixes $H_1$ through $H_7$ and a plurality of zero-blocks or zero-matrixes 0. In this regard, the sub-matrixes $H_1$ through $H_7$ may include elements other than 0, whereas the zero-matrixes include only elements of 0. Thus, the sub-matrixes $H_1$ through $H_7$ may be referred to as non-zero matrixes.

In the present exemplary embodiment, the first data set DS1 may include the first sub-matrix $H_1$, the second data set DS2 may include the second sub-matrix $H_2$ and the zero-matrix 0, the third data set DS3 may include the third sub-matrix $H_3$ and the zero-matrix 0, the fourth data set DS4 may include the zero-matrix 0 and the third sub-matrix $H_4$, and the fifth data set DS5 may include the zero-matrix 0 and the fifth sub-matrix $H_5$. The first parity set PS1 may include the sixth sub-matrix $H_6$ and the zero-matrix 0, and the second parity set PS2 may include the zero matrix 0 and the seventh sub-matrix $H_7$.

In the present exemplary embodiment, since the elements included in the lower $p_2$ rows of the first parity set PS1 are always 0, when there is a partial write request for partial information data corresponding to the fourth data set DS4 or the fifth data set DS5, a parity bit corresponding to the first parity set PS1 is not updated. Likewise, since the elements included in the upper $p_1$ rows of the second parity set PS2 are always 0, when there is the partial write request for partial information data corresponding to the second data set DS2 or the third data set DS3, a parity bit corresponding to the second parity set PS2 is not updated.

However, the disclosure is not limited thereto. In another exemplary embodiment, locations of the first through fifth data sets DS1 through DS5 in a column direction may be changed in various ways. For example, the locations of the third data set DS3 and the fourth data set DS4 in the column direction may be changed. For another example, the locations of the third data set DS3 and the fifth data set DS5 in the column direction may be changed.

However, the disclosure is not limited thereto. In another exemplary embodiment, the second and fifth data sets DS2 through DS5 may include two or more sub-matrixes or two or more zero-matrixes. Likewise, the first and second parity sets PS1 and PS2 may include two or more sub-matrixes or two or more zero-matrixes. In this case, locations of the two or more sub-matrixes or the two or more zero-matrixes included in the second data set DS2 or the third data set DS3 in a row direction may correspond to locations of the two or more sub-matrixes or the two or more zero-matrixes included in the first parity set PS1 in the row direction. Likewise, locations of the two or more sub-matrixes or the two or more zero-matrixes included in the fourth data set DS4 or the fifth data set DS5 in a row direction may correspond to locations of the two or more sub-matrixes or the two or more zero-matrixes included in the second parity set PS2 in the row direction.

Figure 11A:
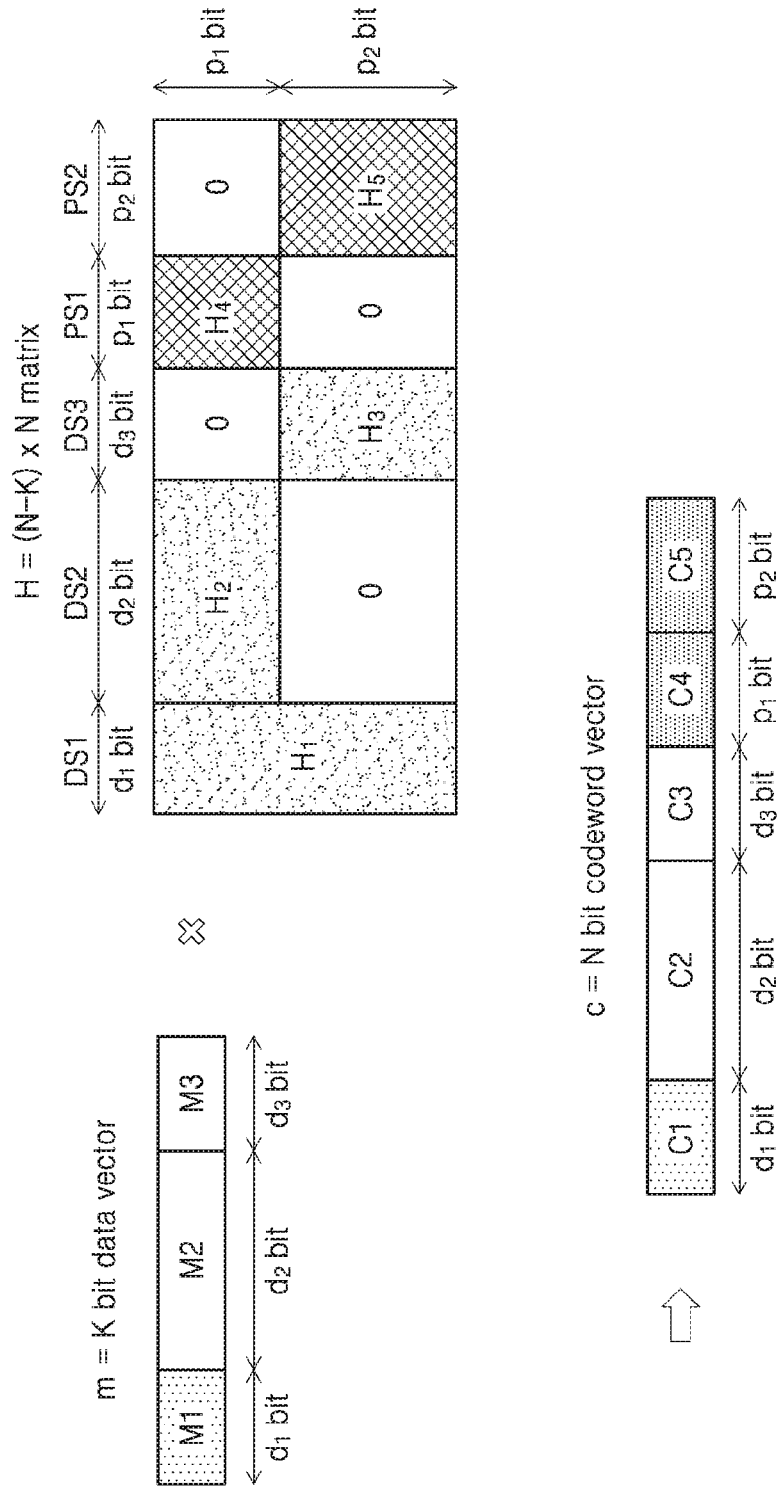
FIGS. 11A through 11C are diagrams for explaining operations of generating a codeword by using a parity check matrix for a partial program operation according to an exemplary embodiment.
Figure 11B:
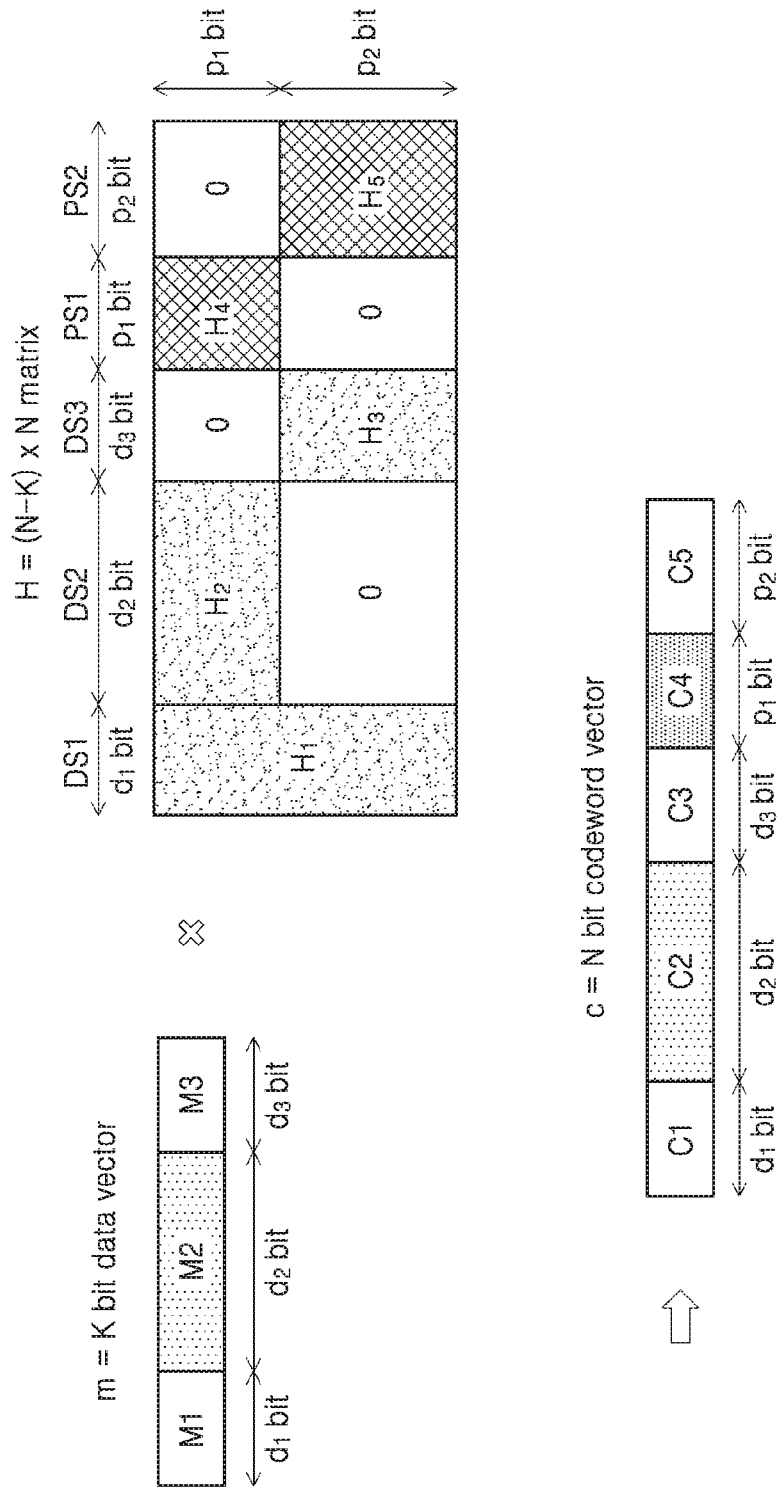
Figure 11C:
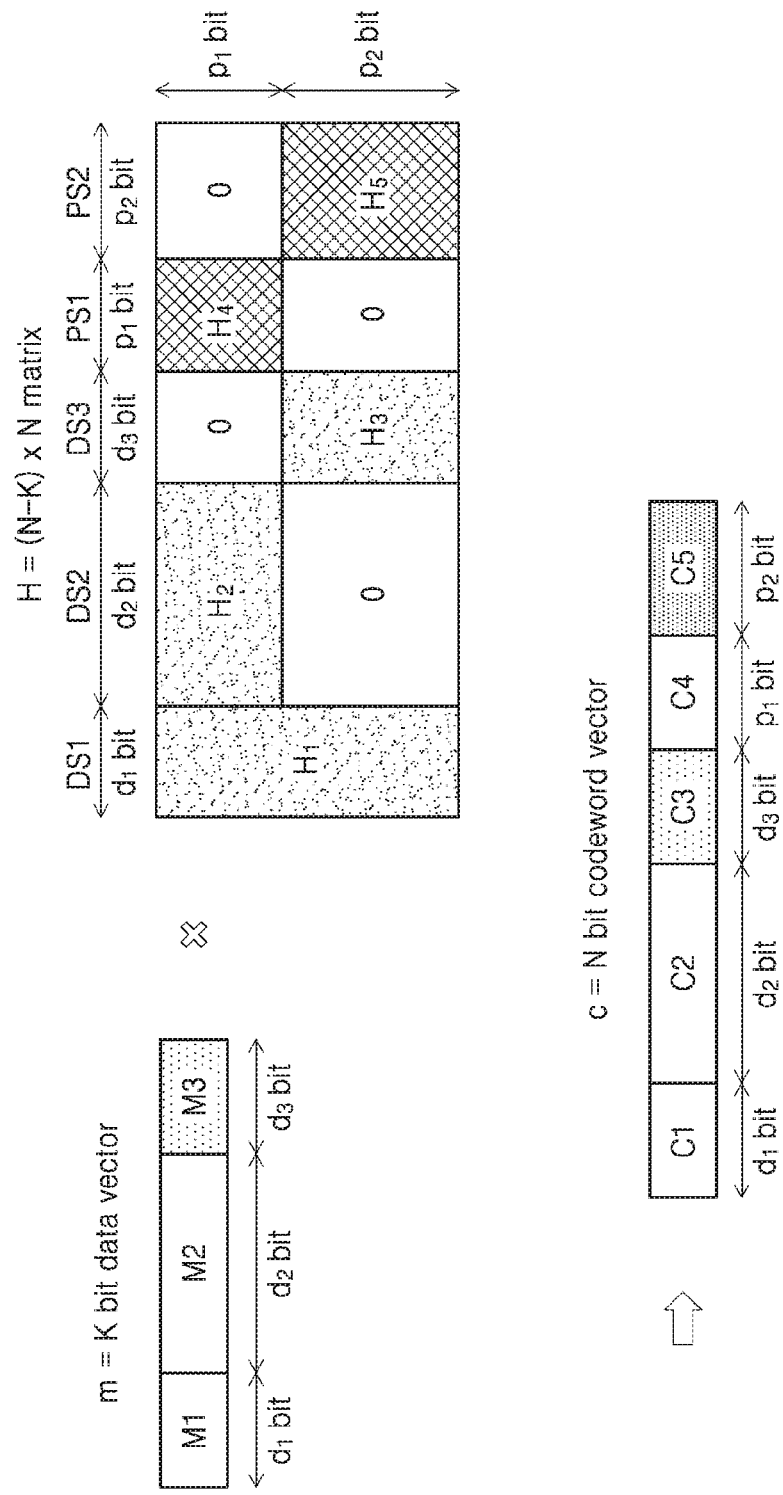

FIGS. 11A through 11C are diagrams for explaining operations of generating a codeword by using the parity check matrix H for a partial program operation according to an exemplary embodiment.

Referring to FIGS. 11A through 11C, when a size of the data m is K bits, and a size of the codeword c is N bits, a size of the parity check matrix H is determined as (N−K)×N. In the present exemplary embodiment, the data m may be divided into at least three pieces of partial information data, i.e., the first through third information data M1, M2, and M3, in correspondence to a first program unit. In other words, the first through third information data M1, M2, and M3 are partial information data corresponding to a second program unit that is a part of the first program unit. The first through third information data M1, M2, and M3 may be partial information data corresponding to the second program unit or a multiplication of the second program unit. For example, a size of the first information data M1 may be $d_1$ bits. A size of the second information data M2 may be $d_2$ bits. A size of the third information data M3 may be $d_3$ bits.

FIG. 11A illustrates a codeword generation operation when a partial write request for the first information data M1 is received from a host. In this regard, the codeword generation operation may be performed by the ECC encoder 231 of FIG. 5. A region corresponding to the first information data M1 in the parity check matrix H is the first data set DS1 that includes the first sub-matrix $H_1$.

Since the first sub-matrix $H_1$ may include an element other than 0, when the parity check matrix H is used to generate the codeword c, both the parity bits C4 and C5 corresponding to the first and second sets PS1 and PS2 may be updated. Accordingly, in the codeword c generated through the parity check matrix H, the data bit C1 corresponding to the first information data M1 and the both parity bits C4 and C5 may be updated, and the data bits C2 and C3 corresponding to the second and third information data M2 and M3 may not be updated.

In an embodiment, the codeword c may be generated through an arithmetic operation of the data m and the parity check matrix H. In another embodiment, the general generator matrix G may be obtained from the parity check matrix H, and the codeword c may be generated through an arithmetic operation of the data m and the general generator matrix G. In more detail, the general generator matrix G may be obtained from the parity check matrix H by using the relationship between the general generator matrix G and the parity check matrix H as shown in Equation 3 or 4 above. When a size of the parity check matrix H is (N−K)×N, since a size of the general generator matrix G is K×N, the codeword c having a size 1×N may be generated through the arithmetic operation of the data m and the general generator matrix G.

FIG. 11B illustrates a codeword generation operation when a partial write request for the second information data M2 is received from the host. In this regard, the codeword generation operation may be performed by the ECC encoder 231 of FIG. 5. A region corresponding to the second information data M2 in the parity check matrix H is the second data set DS2 that includes the second sub-matrix $H_2$ and the zero-matrix 0.

Since the second sub-matrix $H_2$ may include an element other than 0, when the parity check matrix H is used to generate the codeword c, only the parity bit C4 corresponding to the first parity set PS1 may be updated. Accordingly, in the codeword c generated through the parity check matrix H, the data bit C2 corresponding to the second information data M2 and the parity bit C4 corresponding to the first parity set PS1 may be updated, and the data bits C1 and C3 corresponding to the first and third information data M1 and M3 and the parity bit C5 corresponding to the second parity set PS2 may not be updated.

FIG. 11C illustrates a codeword generation operation when a partial write request for the third information data M3 is received from the host. In this regard, the codeword generation operation may be performed by the ECC encoder 231 of FIG. 5. A region corresponding to the third information data M3 in the parity check matrix H is the third data set DS3 that includes the zero-matrix 0 and the third sub-matrix $H_3$.

Since the third sub-matrix $H_3$ may include an element other than 0, when the parity check matrix H is used to generate the codeword c, only the parity bit C5 corresponding to the second parity set PS2 may be updated. Accordingly, in the codeword c generated through the parity check matrix H, the data bit C3 corresponding to the third information data M3 and the parity bit C5 corresponding to the second parity set PS2 may be updated, and the data bits C1 and C2 corresponding to the first and second information data M1 and M2 and the parity bit C4 corresponding to the first parity set PS1 may not be updated.

As described above, according to the present exemplary embodiment, the second data set DS2 and the first parity set PS1 may include the zero-matrix 0 corresponding to a same row, and the third data set DS3 and the second parity set PS2 may include the zero-matrix 0 corresponding to the same row in the parity check matrix H. Accordingly, compared to a case of generating parity bits by using the general generator matrix G described with reference to FIGS. 8A through 8C, updated parity bits among all parity bits of the codeword may be reduced. Thus, when a partial write operation is performed on a memory device, the number of cells on which a write operation is performed in a parity region of a memory cell array may be reduced, thereby reducing the speed of wearing out the cells of the parity region.

Figure 12A:
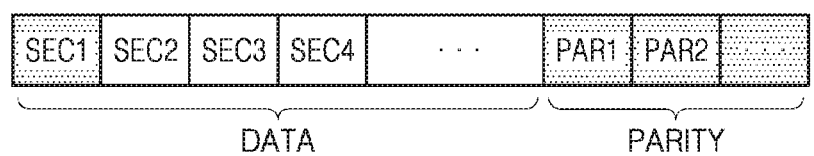
FIGS. 12A and 12B illustrate examples of a partial region of a memory cell array on which a partial program operation is performed according to an exemplary embodiment.
Figure 12B:
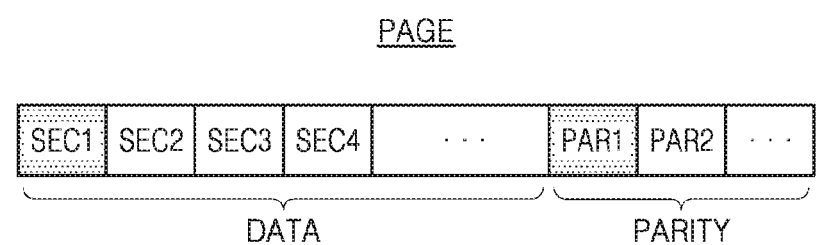

FIGS. 12A and 12B illustrate examples of a partial region of a memory cell array on which a partial program operation is performed according to an exemplary embodiment.

Referring to FIG. 12A, for example, when a partial write operation is performed on the first information data M1 like the embodiment of FIG. 11A, a write operation may be performed on cells included in a partial region of a data region DATA of a single page PAGE, for example, a first sector SEC1 and a whole region of a parity region PARITY.

Referring to FIG. 12B, for example, when the partial write operation is performed on the second information data M2 like the embodiment of FIG. 11B or on the third information data M3 like the embodiment of FIG. 11C, the write operation may be performed on cells included in a partial region of the data region DATA of the single page PAGE, for example, a second sector SEC2 and a partial region of the parity region PARITY.

As described above, according to the present embodiment, the ECC encoder 231 may generate a codeword by performing LDPC encoding using the parity check matrix H while generating the codeword in a partial program operation in such a way that a partial parity bit corresponding to partial information data among all parity bits may be updated. Accordingly, a write or overwrite operation may be performed on only cells corresponding to the updated parity bit in the parity region PARITY of a memory cell array. Thus, when compared to a case of generating the codeword by using the general generator matrix G described with reference to FIGS. 8A through 8C, the number of write or overwrite operations on the cells included in the parity region PARITY of a memory cell array may be reduced, thereby reducing the speed of wearing out the cells of the parity region PARITY.

FIGS. 13 through 16 illustrate other examples of parity check matrixes Ha through Hd according to an exemplary embodiment.

Figure 13:
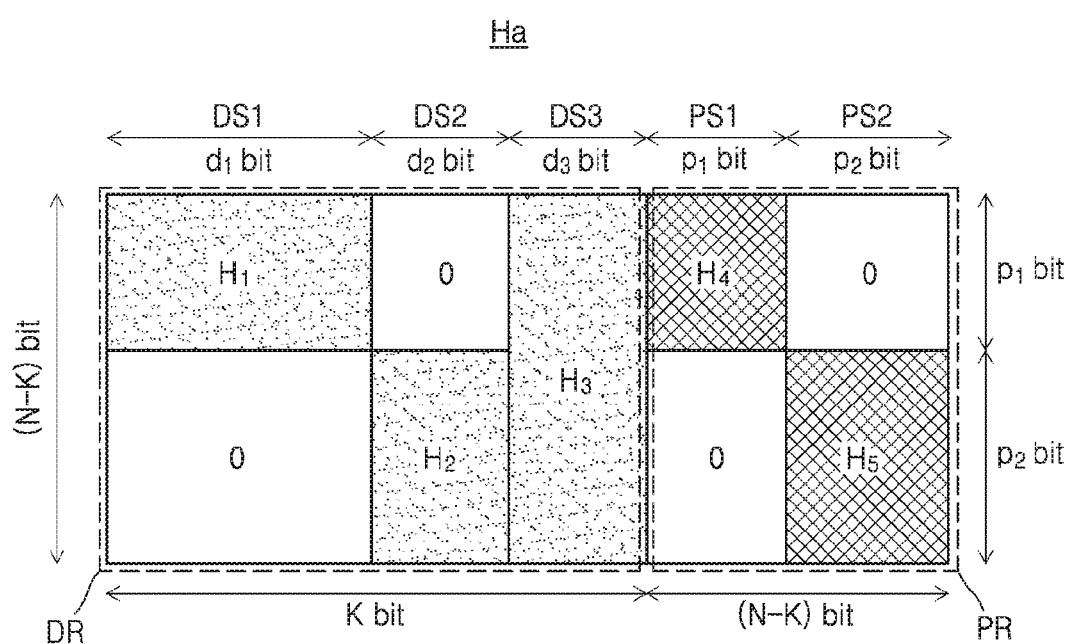
FIGS. 13 through 16 illustrate other examples of a parity check matrix according to an exemplary embodiment.

Referring to FIG. 13, the parity check matrix Ha may include the data region DR and the parity region PR. The data region DR may be divided into the first through third data sets DS1, DS2, and DS3. The parity region PR may be divided into the first and second parity sets PS1 and PS2. In the present exemplary embodiment, a column size of the first data set DS1 is $d_1$. A column size of the second data set DS2 is $d_2$. A column size of the third data set DS3 is $d_3$. A sum of $d_1$, $d_2$, and $d_3$ may correspond to K (i.e., $d_1+d_2+d_3=K$). Meanwhile, a column size of the first parity set PS1 is $p_1$. A column size of the second parity set PS2 is $p_2$. A sum of $p_1$ and $p_2$ may correspond to (N−K) (i.e., $p_1+p_2=N-K$).

In the present exemplary embodiment, elements included in $d_3$ columns included in the third data set DS3 may not be restricted. Thus, the elements included in the third data set DS3 may be generated by using a method of generating a parity check matrix for usual LDPC coding.

Meanwhile, in the present exemplary embodiment, in $d_1$ columns included in the first data set DS1, elements included in lower $p_2$ rows are always 0, and in $d_2$ columns included in the second data set DS2, elements included in upper $p_1$ rows are always 0. Likewise, in $p_1$ columns included in the first parity set PS1, elements included in lower $p_2$ rows are always 0, and in $p_2$ columns included in the second parity set PS2, elements included in upper $p_1$ rows are always 0.

As described above, according to the present exemplary embodiment, the parity check matrix Ha may be divided into the plurality of sub-matrixes $H_1$ through $H_5$ and the plurality of zero-matrixes 0. In this regard, the sub-matrixes $H_1$ through $H_5$ may include elements other than 0, whereas the zero-matrixes 0 unconditionally include only elements of 0.

In the present exemplary embodiment, the first data set DS1 may include the first sub-matrix $H_1$ and the zero-matrix 0, the second data set DS2 may include the zero-matrix 0 and the second sub-matrix $H_2$, and the third data set DS3 may include the third sub-matrix $H_3$. The first parity set PS1 may include the fourth sub-matrix $H_4$ and the zero-matrix 0, and the second parity set PS2 may include the zero matrix 0 and the fifth sub-matrix $H_5$.

In the present exemplary embodiment, since the elements included in the lower $p_2$ rows of the first parity set PS1 are always 0, when there is a partial write request for partial information data corresponding to the second data set DS2, a parity bit corresponding to the first parity set PS1 is not updated. Likewise, since the elements included in the upper $p_1$ rows of the second parity set PS2 are always 0, when there is the partial write request for partial information data corresponding to the first data set DS1, a parity bit corresponding to the second parity set PS2 is not updated.

Figure 14:
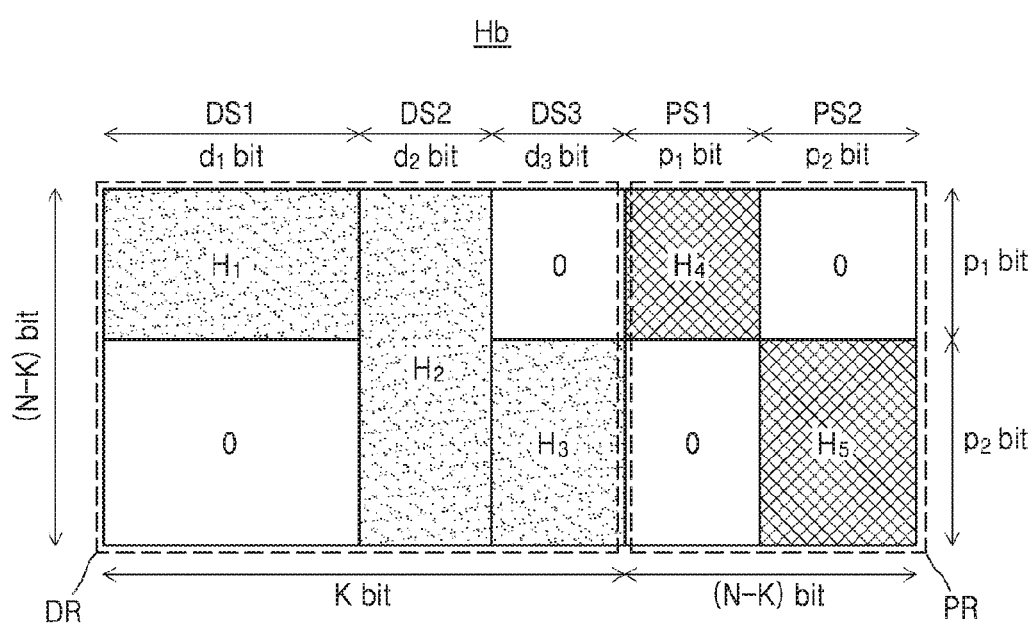

Referring to FIG. 14, the parity check matrix Hb may include the data region DR and the parity region PR. The data region DR may be divided into the first through third data sets DS1, DS2, and DS3. The parity region PR may be divided into the first and second parity sets PS1 and PS2. In the present exemplary embodiment, a column size of the first data set DS1 is $d_1$. A column size of the second data set DS2 is $d_2$. A column size of the third data set DS3 is $d_3$. A sum of $d_1$, $d_2$, and $d_3$ may correspond to K (i.e., $d_1+d_2+d_3=K$). Meanwhile, a column size of the first parity set PS1 is $p_1$. A column size of the second parity set PS2 is $p_2$. A sum of $p_1$ and $p_2$ may correspond to (N−K) (i.e., $p_1+p_2=N-K$).

In the present exemplary embodiment, elements included in $d_2$ columns included in the second data sets DS2 may not be restricted. Thus, the elements included in the second data set DS2 may be generated by using a method of generating a parity check matrix for usual LDPC coding.

Meanwhile, in the present exemplary embodiment, in $d_1$ columns included in the first data set DS1, elements included in lower $p_2$ rows are always 0, and in $d_3$ columns included in the third data set DS3, elements included in upper $p_1$ rows are always 0. Likewise, in $p_1$ columns included in the first parity set PS1, elements included in lower $p_2$ rows are always 0, and in $p_2$ columns included in the second parity set PS2, elements included in upper $p_1$ rows are always 0.

As described above, according to the present exemplary embodiment, the parity check matrix Hb may be divided into the plurality of sub-matrixes $H_1$ through $H_5$ and the plurality of zero-matrixes 0. In this regard, the sub-matrixes $H_1$ through $H_5$ may include elements other than 0, whereas the zero-matrixes 0 unconditionally include only elements of 0.

In the present exemplary embodiment, the first data set DS1 may include the first sub-matrix $H_1$ and the zero-matrix 0, the second data set DS2 may include the second sub-matrix $H_2$, and the third data set DS3 may include the zero-matrix 0 and the third sub-matrix $H_3$. The first parity set PS1 may include the fourth sub-matrix $H_4$ and the zero-matrix 0, and the second parity set PS2 may include the zero matrix 0 and the fifth sub-matrix $H_5$.

In the present exemplary embodiment, since the elements included in the lower $p_2$ rows of the first parity set PS1 are always 0, when there is a partial write request for partial information data corresponding to the third data set DS3, a parity bit corresponding to the first parity set PS1 is not updated. Likewise, since the elements included in the upper $p_1$ rows of the second parity set PS2 are always 0, when there is the partial write request for partial information data corresponding to the first data set DS1, a parity bit corresponding to the second parity set PS2 is not updated.

Figure 15:
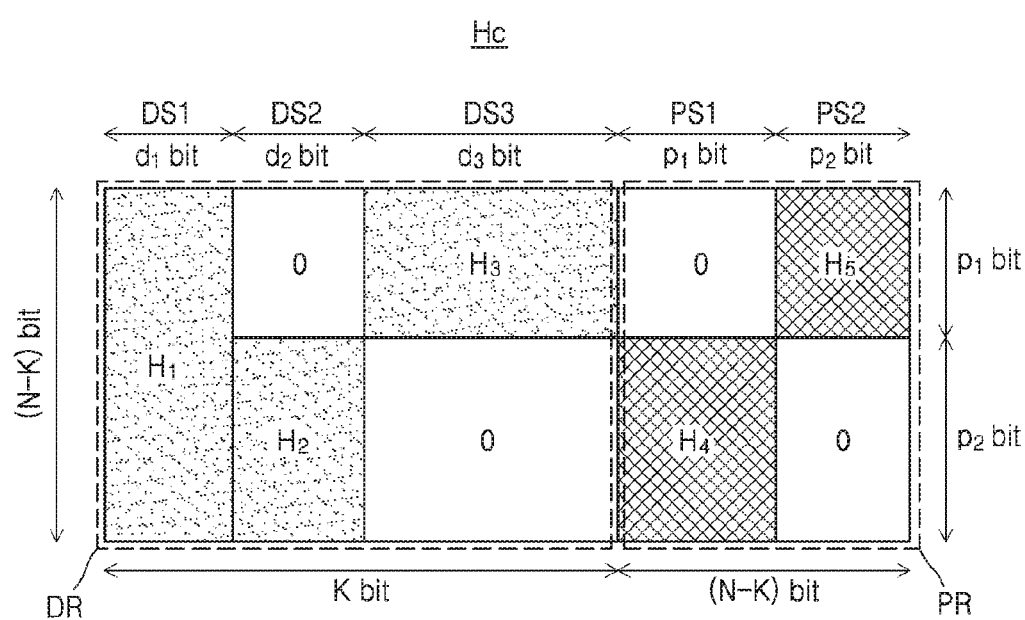

Referring to FIG. 15, the parity check matrix Hc may include the data region DR and the parity region PR. The data region DR may be divided into the first through third data sets DS1, DS2, and DS3. The parity region PR may be divided into the first and second parity sets PS1 and PS2. In the present exemplary embodiment, a column size of the first data set DS1 is $d_1$. A column size of the second data set DS2 is $d_2$. A column size of the third data set DS3 is $d_3$. A sum of $d_1$, $d_2$, and $d_3$ may correspond to K (i.e., $d_1+d_2+d_3=K$). Meanwhile, a column size of the first parity set PS1 is $p_1$. A column size of the second parity set PS2 is $p_2$. A sum of $p_1$ and $p_2$ may correspond to (N−K) (i.e., $p_1+p_2=N-K$).

In the present exemplary embodiment, elements included in $d_1$ columns included in the first data set DS1 may not be restricted. Thus, the elements included in the first data set DS1 may be generated by using a method of generating a parity check matrix for usual LDPC coding.

Meanwhile, in the present exemplary embodiment, in $d_2$ columns included in the second data set DS2, elements included in upper $p_1$ rows are always 0, and in $d_3$ columns included in the third data set DS3, elements included in lower $p_2$ rows are always 0. Likewise, in $p_1$ columns included in the first parity set PS1, elements included in upper $p_1$ rows are always 0, and in $p_2$ columns included in the second parity set PS2, elements included in lower $p_2$ rows are always 0.

As described above, according to the present exemplary embodiment, the parity check matrix Hc may be divided into the plurality of sub-matrixes $H_1$ through $H_5$ and the plurality of zero-matrixes 0. In this regard, the sub-matrixes $H_1$ through $H_5$ may include elements other than 0, whereas the zero-matrixes 0 unconditionally include only elements of 0.

In the present exemplary embodiment, the first data set DS1 may include the first sub-matrix $H_1$, the second data set DS2 may include the zero-matrix 0 and the second sub-matrix $H_2$, and the third data set DS3 may include the third sub-matrix $H_3$ and the zero-matrix 0. The first parity set PS1 may include the zero-matrix 0 and the fourth sub-matrix $H_4$, and the second parity set PS2 may include the fifth sub-matrix $H_5$ and the zero matrix 0.

In the present exemplary embodiment, since the elements included in the upper $p_1$ rows of the first parity set PS1 are always 0, when there is a partial write request for partial information data corresponding to the third data set DS3, a parity bit corresponding to the first parity set PS1 is not updated. Likewise, since the elements included in the lower $p_2$ rows of the second parity set PS2 are always 0, when there is the partial write request for partial information data corresponding to the second data set DS2, a parity bit corresponding to the second parity set PS2 is not updated.

Although not shown, a location of a data set that does not include the zero matrix 0 and having no restriction in the parity check matrix Hc may be changed as shown in FIGS. 13 and 14.

Figure 16:
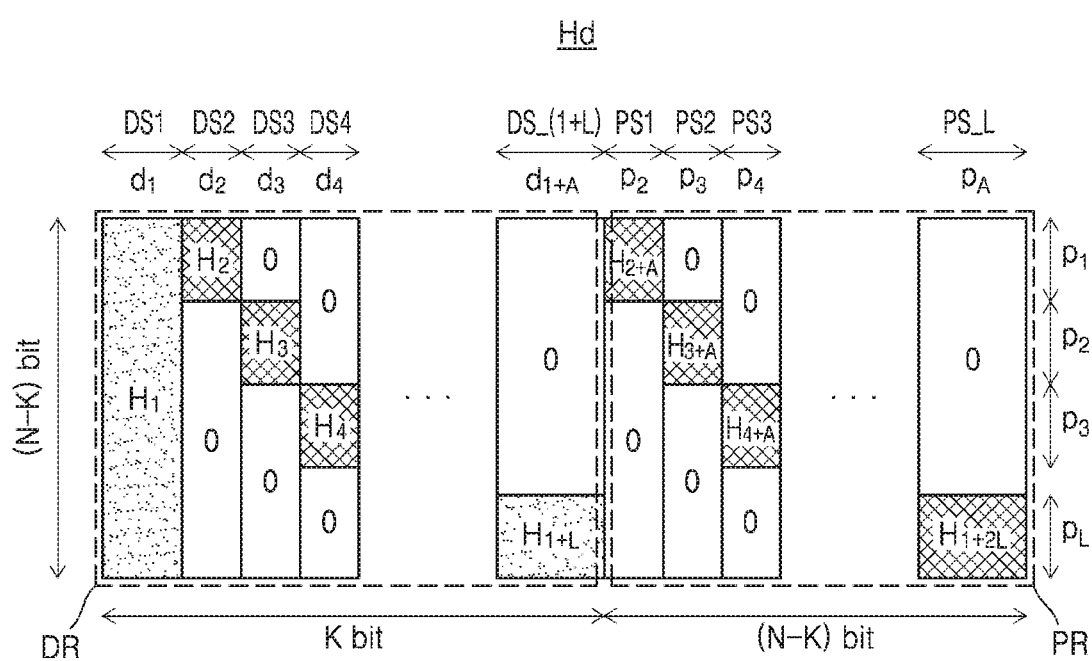

Referring to FIG. 16, the parity check matrix Hd may include the data region DR and the parity region PR. The data region DR may be divided into the first through 1+Lth data sets DS1 through DS_1+L. The parity region PR may be divided into the first through Lth parity sets PS1 through PS_L. In the present exemplary embodiment, a column size of the first data set DS1 is $d_1$. A column size of the second data set DS2 is $d_2$. A column size of the third data set DS3 is $d_3$. A column size of the 1+Lth data set DS_1+L is $d_{1+L}$. A sum of $d_1$ through $d_{1+L}$ may correspond to K (i.e., $d_1+\ldots+d_{1+L}=K$). Meanwhile, a column size of the first parity set PS1 is $p_1$. A column size of the second parity set PS2 is $p_2$. A column size of the Lth parity set PS_L is $p_L$. A sum of $p_1$ through $p_L$ may correspond to (N−K) (i.e., $p_1+\ldots+p_L=N-K$).

In the present exemplary embodiment, elements included in $d_1$ columns included in the first data set DS1 may not be restricted. Thus, the elements included in the first data set DS1 may be generated by using a method of generating a parity check matrix for usual LDPC coding. In this regard, a location of the first data set DS1 having no restriction to the elements may be changed in various ways.

Meanwhile, in the present exemplary embodiment, in $d_2$ columns included in the second data set DS2, elements included in rows except for $p_1$ rows from a first row through a $p_1$ row are always 0, in $d_3$ columns included in the third data set DS3, elements included in rows except for $p_2$ rows from a $p_1+1$th row through a $p_1+p_2$th row are always 0, and in $d_{1+L}$ columns included in the 1+Lth data set DS_1+L, elements included in rows except for $p_L$ rows from a $$\sum_{1+i=1}^{L-1} p_i$$

row through a $$\sum_{i=1}^{L} p_i$$

row are always 0.

Likewise, in $p_1$ columns included in the first parity set PS1, elements included in rows except for $p_1$ rows from the first row through the $p_1$ row are always 0, in $p_2$ columns included in the second parity set PS2, elements included in rows except for $p_2$ rows from the $p_1+1$th row through the $p_1+p_2$th row are always 0, and in $p_L$ columns included in the Lth parity set PS_L, elements included in rows except for $p_L$ rows from the $$\sum_{1+i=1}^{L-1} p_i$$

row through the $$\sum_{i=1}^{L} p_i$$

row are always 0.

As described above, according to the present exemplary embodiment, the parity check matrix Hd may be divided into a plurality of sub-matrixes $H_1$ through $H_{1+2L}$ and the plurality of zero-matrixes 0. In this regard, the sub-matrixes $H_1$ through $H_{1+2L}$ may include elements other than 0, whereas the zero-matrixes 0 unconditionally include only elements of 0.

In the present exemplary embodiment, the first data set DS1 may include the first sub-matrix $H_1$ and the zero-matrix 0, the second data set DS2 may include the second sub-matrix $H_2$ and the zero-matrix 0, the third data set DS3 may include the third sub-matrix $H_3$ and the zero-matrix 0, and the 1+Lth data set DS_1+L may include a 1+Lth sub matrix $H_{1+L}$ and the zero-matrix 0. The first parity set PS1 may include a 2+Lth sub-matrix $H_{2+L}$ and the zero-matrix 0, the second parity set PS2 may include a 3+Lth sub-matrix $H_{3+L}$ and the zero-matrix 0, and the Lth parity set PS_L may include a 1+2Lth sub matrix $H_{1+2L}$ and the zero-matrix 0.

In the present exemplary embodiment, when there is a partial write request for partial information data corresponding to the third through 1+Lth data sets DS3 through DS_1+L, a parity bit corresponding to the first parity set PS1 is not updated. In other words, only when there is the partial write request for partial information data corresponding to the first and second data sets DS1 and DS2, the parity bit corresponding to the first parity set PS1 is updated.

Likewise, when there is the partial write request for partial information data corresponding to the second data set DS2 and the fourth through 1+Lth data sets DS4 through DS_1+L, a parity bit corresponding to the second parity set PS2 is not updated. In other words, only when there is the partial write request for partial information data corresponding to the first and third data sets DS1 and DS3, the parity bit corresponding to the second parity set PS2 is updated.

The above-described modifications of the parity check matrixes Ha through Hd are merely examples of the disclosure, and the disclosure is not limited thereto. In another exemplary embodiment, each data set and each parity set may include two or more sub-matrixes or two or more zero-matrixes. In another exemplary embodiment, a location of a single data set that does not include a zero-matrix may be freely changed in a data region.

Figure 17:
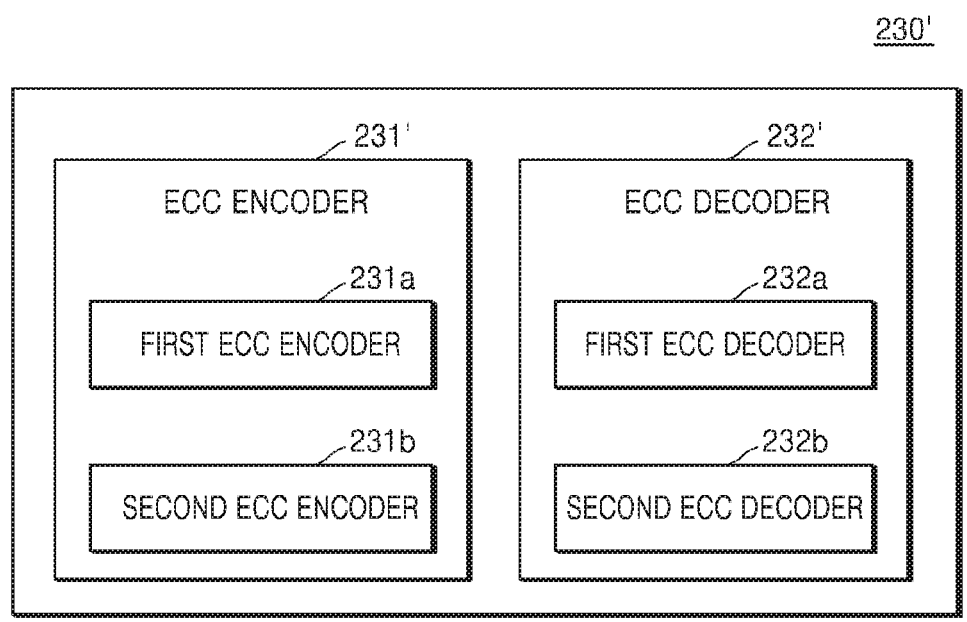
FIG. 17 is a block diagram of another example of an ECC processing unit included in a memory controller of FIG. 1 according to an exemplary embodiment.

FIG. 17 is a block diagram of another example of an ECC processing unit 230' included in a memory controller of FIG. 1 according to an exemplary embodiment.

Referring to FIG. 17, the ECC processing unit 230' may include an ECC encoder 231' and an ECC decoder 232'. The ECC encoder 231' may include a first ECC encoder 231a and a second ECC encoder 231b. The ECC decoder 232' may include a first ECC decoder 232a and a second ECC decoder 232b. In the present exemplary embodiment, the ECC processing unit 230' may perform ECC encoding and ECC decoding by using an ECC of a product code structure.

In the present exemplary embodiment, the first ECC encoder 231a may perform encoding on information data in a row direction, and the second ECC encoder 231b may perform encoding on the information data in a column direction. Meanwhile, the first ECC decoder 232a may perform decoding on the information data in the row direction, and the second ECC decoder 232b may perform decoding on the information data in the column direction. In this regard, the information data may be implemented in a data block.

FIG. 18 illustrates an example of an ECC structure used in the ECC processing unit 230' of FIG. 17 according to an exemplary embodiment.

Referring to FIG. 18, the first ECC encoder 231a may generate a first parity Parity1 on a first data block Data1, a second data block Data2, and a third data block Data3. The first ECC encoder 231a may generate a second parity Parity2 on a fourth data block Data4, a fifth data block Data5, and a sixth data block Data6. The first ECC encoder 231a may generate a third parity Parity3 on a seventh data block Data7, an eighth data block Data8, and a ninth data block Data9.

Meanwhile, the second ECC encoder 231b may generate a fourth parity Parity4 on the first data block Data1, the fourth data block Data4, and the seventh data block Data7. The second ECC encoder 231b may generate a fifth parity Parity5 on the second data block Data2, the fifth data block Data5, and the eighth data block Data8. The second ECC encoder 231b may generate a sixth parity Parity6 on the third data block Data3, the sixth data block Data6, and the ninth data block Data9. In this regard, each of the first through ninth data blocks Data1 through Data9 may be a minimum unit of a partial program or a multiplication thereof.

FIG. 19 illustrates an example of a partial program operation using the ECC structure of FIG. 18 according to an exemplary embodiment.

Referring to FIG. 19, in the present exemplary embodiment, when a partial write request for the fourth data block Data4 is received from a host, the first ECC encoder 231a may update the second parity Parity2, and may not update the first and third parities Parity1 and Parity3. The second EE encoder 231b may update the fourth parity Parity4 and may not update the fifth and sixth parities Parity5 and Parity6. As described above, according to the present exemplary embodiment, all parity bits of a codeword may not be updated, and only a parity bit corresponding to a partial data block corresponding to partial information data may be updated. Thus, the number of write operations or overwrite operations on cells included in a parity region of a memory cell array may be reduced, and thus the speed of wearing out the cells with respect to the cells included in the parity region may be reduced.

Figure 20:
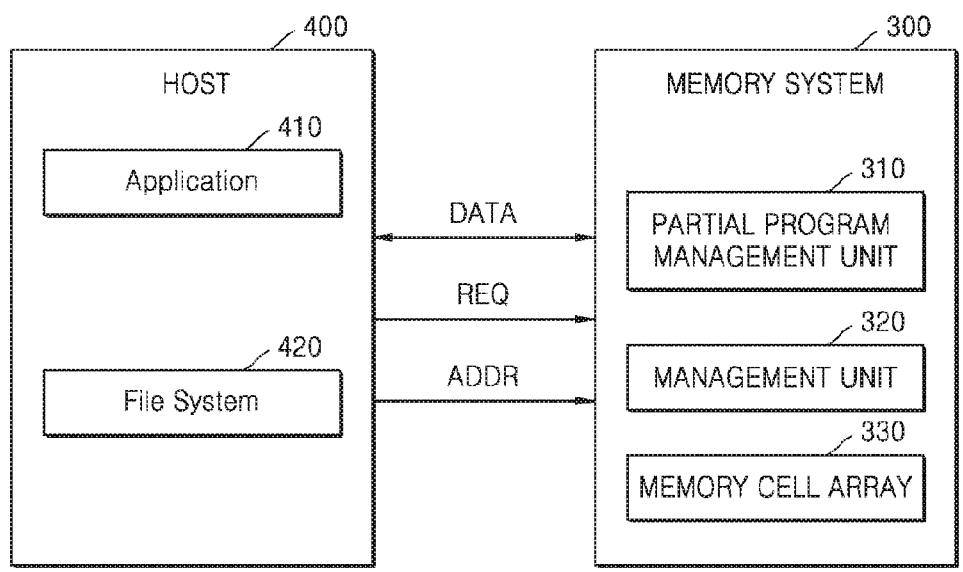
FIG. 20 is a block diagram of a computing system according to an exemplary embodiment.

FIG. 20 is a block diagram of a computing system 20 according to an exemplary embodiment.

Referring to FIG. 20, the computing system 20 may include a memory system 300 and a host 400. The memory system 300 may include a partial program management unit 310, an ECC processing unit 320, and a memory cell array 330. The memory system 300 may be implemented in a substantially similar manner to the memory system 10 of FIG. 1. Accordingly, the descriptions provided with reference to FIGS. 1 through 19 above may be applied to the present exemplary embodiment, and thus redundant descriptions are omitted.

The host 400 may include an application 410 and a file system 420 corresponding to a software layer. In more detail, the application 410 may generate a write request or a read request for the memory system 300, and the file system 420 may receive the write request or the read request and may generate a command or an address that is to be provided to the memory system 300.

In the present exemplary embodiment, the host 400 may provide the memory system 300 with the information data DATA corresponding to a second program unit that is a part of a first program unit, a write request REQ for the information data DATA, and the address ADDR corresponding to the write request REQ. The host 400 may provide the memory system 300 with the read request REQ for the information data DATA corresponding to the second program unit that is a part of the first program unit and the address ADDR corresponding to the read request REQ and may receive the data DATA read from the memory system 300.

Figure 21:
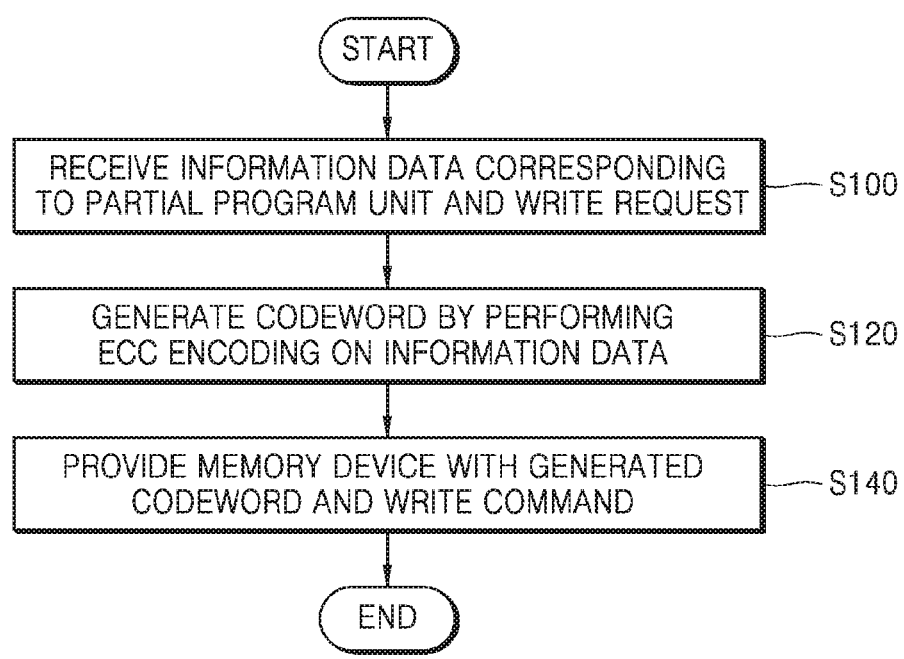
FIG. 21 is a flowchart of a method of operating a memory system, according to an exemplary embodiment.

FIG. 21 is a flowchart of a method of operating a memory system, according to an exemplary embodiment.

Referring to FIG. 21, the method of operating the memory system according to the present exemplary embodiment is a method of performing a partial program operation on a memory device, and thus the descriptions provided with reference to FIGS. 1 through 20 above are applied to a method of operating the memory device according to the present exemplary embodiment. Hereinafter, the method of operating the memory device according to the present exemplary embodiment will be described in detail with reference to FIGS. 1 through 21.

In operation S100, information data corresponding to a partial program unit and a write request are received. In this regard, the partial program unit may be a second program unit that is a part of a first program unit. In an exemplary embodiment, the first program unit may be a page unit, and the second program unit may be a byte unit. For example, the memory controller 200 may receive partial information data corresponding to the second program unit that is a part of the first program unit and a write request for the partial information data from a host.

In operation S120, a codeword is generated by performing ECC encoding on the information data. In the present exemplary embodiment, the codeword may be generated such that a partial parity bit corresponding to the information data among all parity bits of the first program unit may be updated. Thus, if the write request for the partial information data corresponding to the second program unit that is a part of the first program unit is received from the host, the ECC processing unit 230 may generate the codeword such that only a partial parity bit corresponding to the partial information data among all the parity bits of the first program unit may be updated. Meanwhile, if a write request for whole information data corresponding to the first program unit is received from the host, the ECC processing unit 230 may generate the codeword such that all the parity bits of the first program unit may be updated.

In operation S140, the generated codeword and a write command are provided to the memory device. In the present exemplary embodiment, the partial information data and the parity bit only corresponding to the partial information data included in the codeword may be updated, and remaining information data and remaining parity bits may not be updated. Thus, data bits included in the codeword may be written or overwritten to a memory cell array included in the memory device. In this regard, a write or overwrite operation may be performed on only cells corresponding to the updated partial information data and the updated parity bit of the codeword, and the write or overwrite operation may not be performed on cells corresponding to partial information data and parity bits that are not updated in the codeword.

In the present exemplary embodiment, the partial program operation may be performed on a resistive memory device. When the partial program operation is performed, the codeword may be generated such that the partial information data and the parity bit corresponding to the partial information data may only be updated. Accordingly, the write or overwrite operation may be performed on only cells corresponding to bits updated in a single page included in the memory cell array. Thus, when the partial program operation is performed, the speed of wearing out cells included in a parity region of the memory cell array may be reduced.

Figure 22:
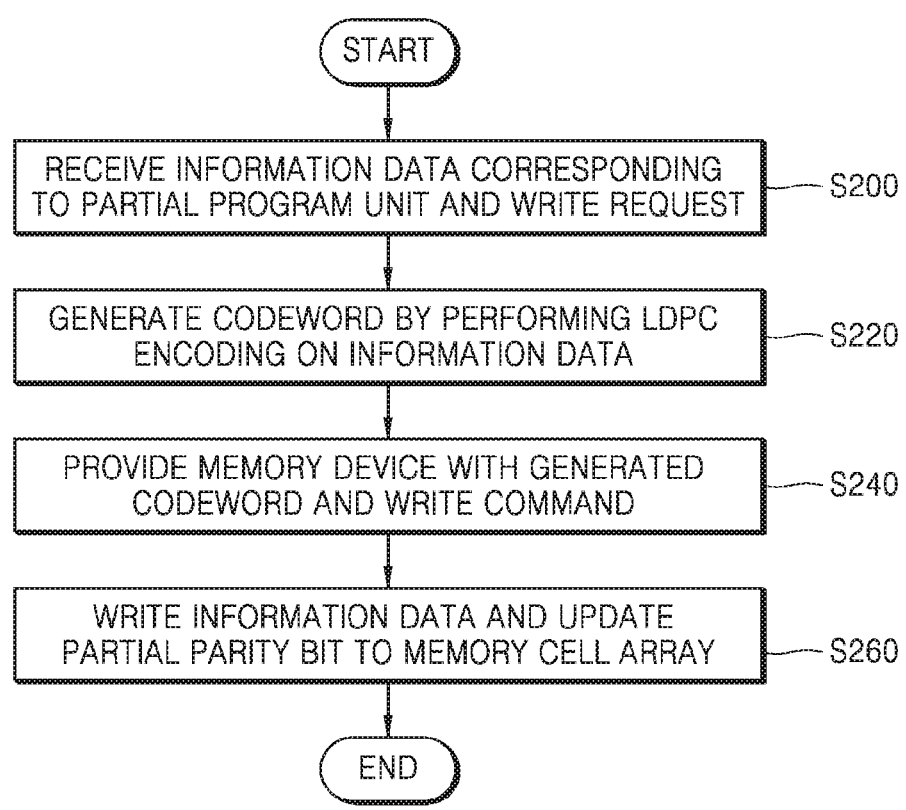
FIG. 22 is a flowchart of a method of operating a memory system, according to another exemplary embodiment.

FIG. 22 is a flowchart of a method of operating a memory system, according to another exemplary embodiment.

Referring to FIG. 22, the method of operating the memory system according to the present exemplary embodiment is a method of performing a partial program operation on a memory device, and thus the descriptions provided with reference to FIGS. 1 through 20 above are applied to a method of operating the memory device according to the present exemplary embodiment. Hereinafter, the method of operating the memory device according to the present exemplary embodiment will be described in detail with reference to FIGS. 1 through 20 and 22.

In operation S200, information data corresponding to a partial program unit and a write request are received. In this regard, the partial program unit may be a second program unit that is a part of a first program unit. In an exemplary embodiment, the first program unit may be a page unit, and the second program unit may be a byte unit. For example, the memory controller 200 may receive partial information data corresponding to the second program unit that is a part of the first program unit and a write request for the partial information data from a host.

In operation S220, a codeword is generated by performing LDPC encoding on the information data. In the present exemplary embodiment, the codeword may be generated such that a partial parity bit corresponding to the information data among all parity bits of the first program unit may be updated. Thus, if the write request for the partial information data corresponding to the second program unit that is a part of the first program unit is received from the host, the ECC processing unit 230 may generate the codeword such that only a partial parity bit corresponding to the partial information data among all the parity bits of the first program unit may be updated. Meanwhile, if a write request for whole information data corresponding to the first program unit is received from the host, the ECC processing unit 230 may generate the codeword such that all the parity bits of the first program unit may be updated.

In the present exemplary embodiment, the ECC processing unit 230 may perform ECC encoding by using an LDPC code. In more detail, the ECC processing unit 230 may generate parity from the information data by using a parity check matrix and then may generate the codeword including the information data and the generated parity.

In operation S240, the generated codeword and a write command are provided to the memory device. In the present exemplary embodiment, the partial information data and the parity bit only corresponding to the partial information data included in the codeword may be updated, and remaining information data and remaining parity bits may not be updated.

In operation S260, the information data and the updated partial parity bit are written to a memory cell array. In this regard, a write or overwrite operation may be performed on only cells corresponding to the updated partial information data and the updated parity bit of the codeword, and the write or overwrite operation may not be performed on cells corresponding to partial information data and parity bits that are not updated in the codeword.

According to the present exemplary embodiment, the partial program operation may be performed on a resistive memory device. When the partial program operation is performed, the codeword may be generated such that the partial information data and the parity bit corresponding to the partial information data may only be updated. Accordingly, the write or overwrite operation may be performed on only cells corresponding to bits updated in a single page included in the memory cell array. Thus, when the partial program operation is performed, the speed of wearing out cells included in a parity region of the memory cell array may be reduced.

Figure 23:
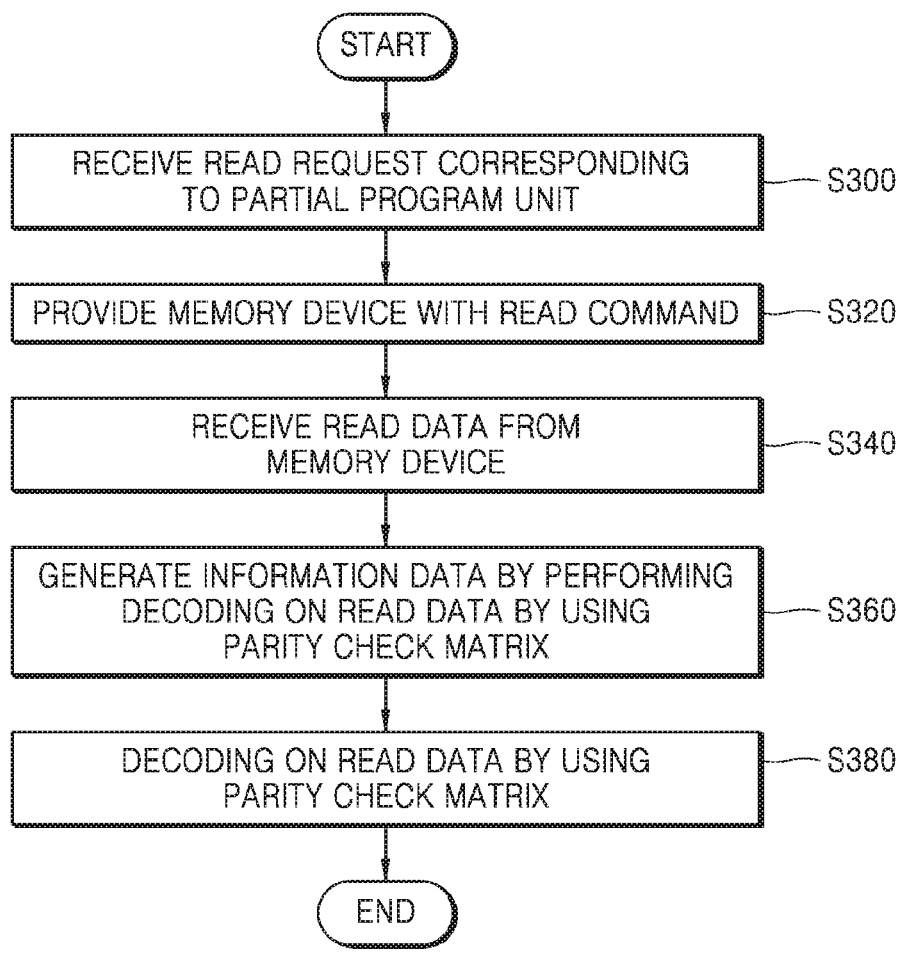
FIG. 23 is a flowchart of a method of operating a memory system, according to another exemplary embodiment.

FIG. 23 is a flowchart of a method of operating a memory system, according to another exemplary embodiment.

Referring to FIG. 23, the method of operating the memory system according to the present exemplary embodiment is a method of performing a partial program operation on a memory device, and thus the descriptions provided with reference to FIGS. 1 through 20 above are applied to a method of operating the memory device according to the present exemplary embodiment. Hereinafter, the method of operating the memory device according to the present exemplary embodiment will be described in detail with reference to FIGS. 1 through 20 and 23.

In operation S300, a read request corresponding to a partial program unit is received. In this regard, the partial program unit may be a second program unit that is a part of a first program unit. In an exemplary embodiment, the first program unit may be a page unit, and the second program unit may be a byte unit. For example, the memory controller 200 may receive the read request for partial information data corresponding to the second program unit that is a part of the first program unit from a host.

In operation S320, a read command is provided to the memory device. For example, the memory controller 200 may provide the memory device 100 with the read command CMD corresponding to the read request and the address ADDR corresponding to the read command CMD.

In operation S340, read data is received from the memory device. For example, the memory controller 200 may receive data stored in cells corresponding to the address ADDR from the memory device 100.

In operation S360, information data is generated by performing ECC decoding on the read data by using a parity check matrix. For example, the ECC processing unit 230 may generate the information data by performing ECC decoding on the read data by using the parity check matrix. In this regard, the parity check matrix used in ECC decoding is the same as the parity check matrix used in ECC encoding.

In operation S380, the generated information data is provided to the host.

Figure 24:
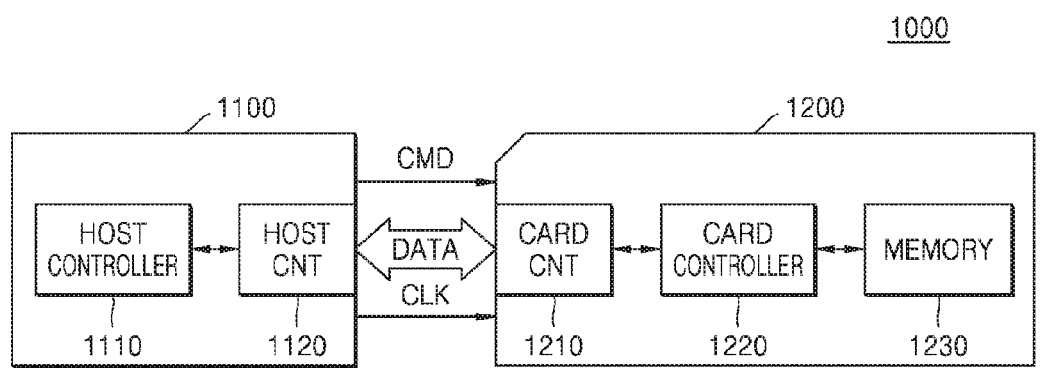
FIG. 24 is a block diagram of an example in which a memory system according to exemplary embodiments is applied to a memory card system.

FIG. 24 is a block diagram illustrating a memory system according to the exemplary embodiments of the disclosure, applied to a memory card system 1000.

Referring to FIG. 24, the memory card system 1000 may include a host 1100 and a memory card 1200. The host 1100 may include a host controller 1110 and a host connector 1120. The memory card 1200 may include a card connector 1210, a card controller 1220, and a memory 1230. The memory card 1200 may be implemented by using the embodiments illustrated in FIGS. 1 through 23.

The host 1100 may write data to the memory card 1200 or read data stored in the memory card 1200. The host controller 1110 may transmit a command CMD, a clock signal CLK generated in a clock generator (not shown) in the host 1100, and data DATA to the memory card 1200 through the host connector 1120.

In response to the command CMD received by using the card connector 1210, the card controller 1220 may store data in the memory 1230 in synchronization with a clock signal generated by a clock generator (not shown) in the card controller 1220. The memory 1230 may store data transmitted from the host 1100.

The memory card 1200 may be a compact flash card (CFC), a Microdrive, a smart media card (SMC), a multimedia card (MMC), a security digital card (SDC), a memory stick, or a universal serial bus (USB) flash memory driver.

Figure 25:
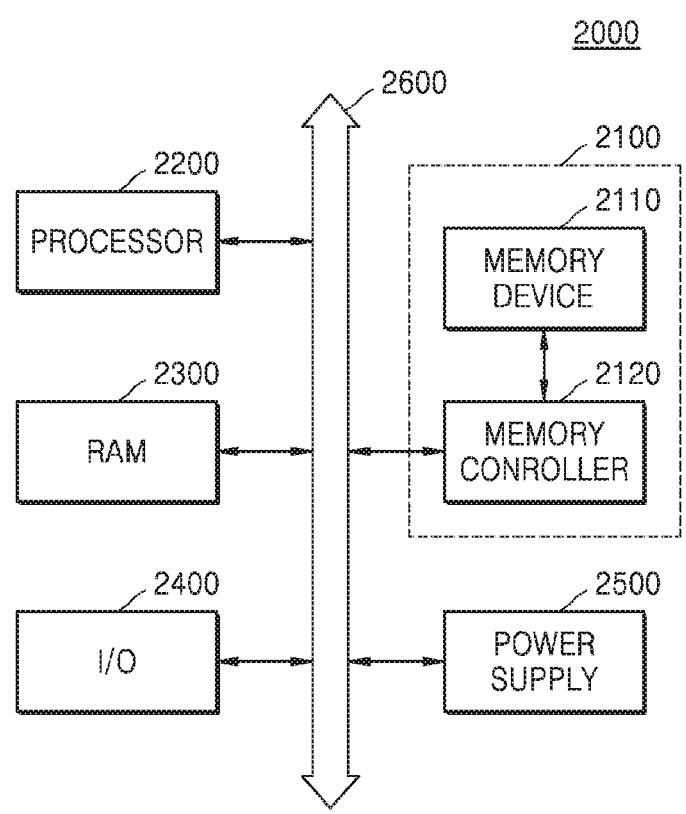
FIG. 25 is a block diagram of a computing system including a memory system according to exemplary embodiments is applied to a memory card system.

FIG. 25 is a block diagram illustrating a computing system 2000 including a memory system 2100 according to exemplary embodiments of the disclosure.

Referring to FIG. 25, the computing system 2000 may include the memory system 2100, a processor 2200, RAM 2300, an input/output device 2400, and a power supply 2500. Meanwhile, although not illustrated in FIG. 25, the computing system 2000 may further include ports via which to communicate with a video card, a sound card, a memory card, or a USB device, or other electronic appliances. The computing system 2000 may be a personal computer or a portable electronic device such as a laptop computer, a mobile phone, a personal digital assistant (PDA) or a camera.

The processor 2200 may perform particular computations or tasks. According to an exemplary embodiment, the processor 2200 may be a micro-processor or a central processing unit (CPU). The processor 2200 may perform communication with the RAM 2300, the input/output device 2400, and the memory system 2100 via a bus 2600 such as an address bus, a control bus, or a data bus. The memory system 2100 may be implemented by using the exemplary embodiments illustrated in FIGS. 1 through 24.

According to an exemplary embodiment, the processor 2200 may also be connected to an extension bus such as a peripheral component interconnect (PCI) bus.

The RAM 2300 may store data needed in operating the computing system 2000. For example, the RAM 2300 may be DRAM, mobile DRAM, SRAM, PRAM, FRAM, RRAM, and/or MRAM.

The input/output device 2400 may include an input unit such as a keyboard, a keypad, or a mouse, and an output unit such as a printer or a display. The power supply 2500 may supply an operating voltage needed in operating the computing system 2000.

Figure 26:
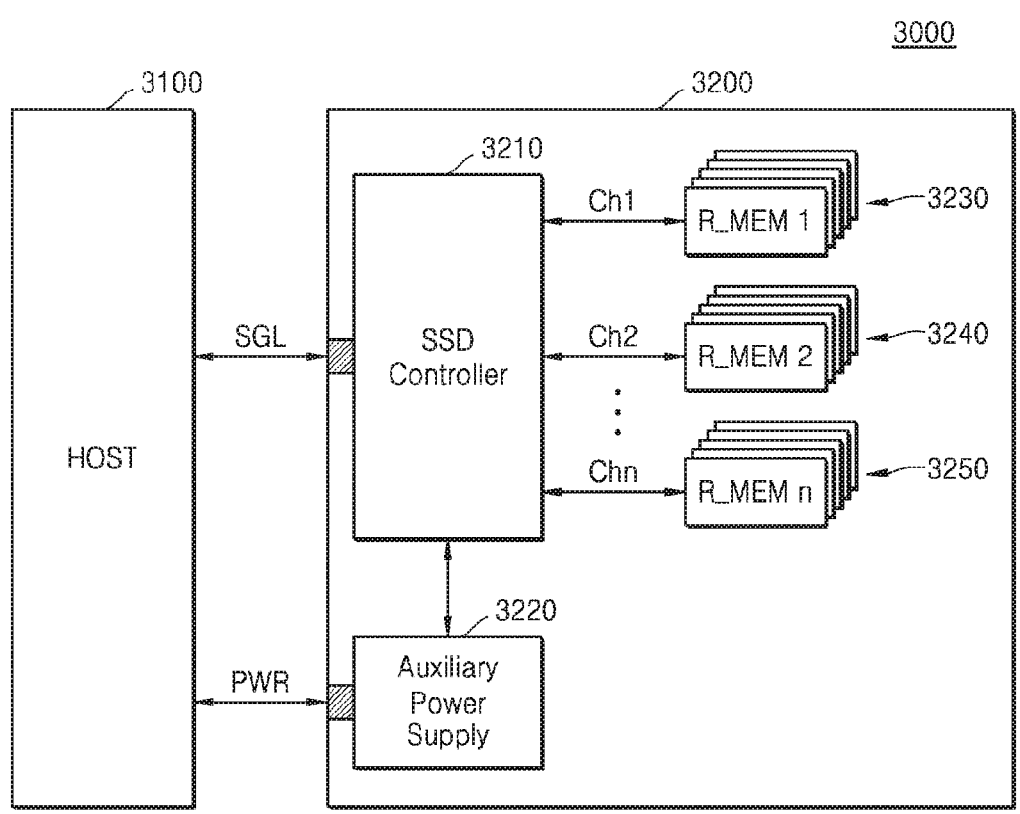
FIG. 26 is a block diagram of an example in which a memory system according to exemplary embodiments is applied to a solid state disk (SSD) system.

FIG. 26 is a block diagram illustrating a memory system according to exemplary embodiments of the disclosure, applied to a solid state disk (SSD) system 3000.

Referring to FIG. 26, the SSD system 3000 may include a host 3100 and an SSD 3200. The SSD 3200 may transmit or receive a signal SGL to and from the host 3100 via a signal connector, and may receive power PWR via a power connector. The SSD 3200 may include an SSD controller 3210, an auxiliary power supply 3220, and a plurality of memory devices 3230, 3240, and 3250. The SSD 3200 may be implemented by using the exemplary embodiments illustrated in FIGS. 1 through 25.

While the disclosure has been particularly shown and described with reference to exemplary embodiments thereof, it will be understood that various changes in form and details may be made therein without departing from the spirit and scope of the following claims.

What is claimed is:

1. A method of operating a memory system, the memory system including a nonvolatile memory device and a memory controller for the nonvolatile memory device, the method comprising:
    the memory controller receiving information data corresponding to a second program unit that is a part of a first program unit and a write request for the information data from a host;
    the memory controller generating a codeword by performing error correction code (ECC) encoding on the information data such that a partial parity bit corresponding to the information data among all parity bits of the codeword is updated;
    the memory controller providing the nonvolatile memory device with the codeword and a write command regarding the codeword; and
    the nonvolatile memory device performing a write operation with respect to the codeword on cells corresponding to the updated partial parity bit and cells corresponding to the information data.

2. The method of claim 1, wherein the ECC encoding is performed by using a low density parity check (LDPC) code.

3. The method of claim 2, wherein the generating of the codeword comprises:
    generating the codeword by using a parity check matrix including a data region divided into (L+1) data sets and a parity region divided into L parity sets, wherein L is an integer equal to or greater than 2, wherein
    a first data set of the (L+1) data sets includes at least one first zero matrix, and a first parity set of the L parity sets includes at least one second zero matrix corresponding to at least one row in which the at least one first zero matrix is disposed.

4. The method of claim 3, wherein:

a size of the first program unit is K bits, a size of the codeword is N bits, and a size of the parity check matrix is (N−K)×N, the data region comprises the first data set having a size (N−K)×$d_1$, a second data set having a size (N−K)×$d_2$, and a third data set having a size (N−K)×$d_3$, the parity region comprises the first parity set having a size (N−K)×$p_1$ and a second parity set having a size (N−K)×$p_2$, and N is an integer greater than 1, K is an integer greater than 0, $d_1$ is a column size of the first data set, $d_2$ is a column size of the second data set, $d_3$ is a column size of the third data set, $p_1$ is a column size of the first parity set, and $p_2$ is a column size of the second parity set.

5. The method of claim 4, wherein:

the first zero matrix corresponds to lower $p_2$ rows of the first data set, and the second zero matrix corresponds to lower $p_2$ rows of the first parity set, and the generating of the codeword comprises: when the information data corresponds to the first data set, generating the codeword such that only parity bits corresponding to the first parity set among all the parity bits are updated.

6. The method of claim 4, wherein:

the second data set includes a third zero matrix corresponding to upper $p_1$ rows, and the second parity set includes a fourth zero matrix corresponding to upper $p_1$ rows, and the generating of the codeword comprises: when the information data corresponds to the second data set, generating the codeword such that only parity bits corresponding to the second parity set among all the parity bits are updated.

7. The method of claim 4, wherein the generating of the codeword comprises, when the information data corresponds to the third data set, generating the codeword such that all the parity bits are updated.

8. The method of claim 3, wherein:

a size of the first program unit is K bits, a size of the codeword is N bits, and a size of the parity check matrix is (N−K)×N, the data region comprises the first data set having a size (N−K)×$d_1$ through an (L+1)th data set having a size (N−K)×$d_{L+1}$, and the parity region comprises the first parity set having a size (N−K)×$p_1$ through an Lth parity set having a size (N−K)×$p_L$, and N is an integer greater than 1, K is an integer greater than 0, $d_1$ is a column size of the first data set, $d_{L+1}$ is a column size of the (L+1)th data set, $p_1$ is a column size of the first parity set, and $p_L$ is a column size of the Lth parity set.

9. The method of claim 8, wherein:

in an Mth data set and an Mth parity set included in the parity check matrix, elements corresponding to rows, other than a $$\sum_{1+i=0}^{M-1} p_i$$

row through a $$\sum_{i=0}^{M} p_i$$

row, are 0, and M is an integer equal to and greater than 1 and equal to and lower than L, and M is an integer greater than 0 and p is an integer equal to or greater than 0.

10. The method of claim 9, wherein the generating of the codeword comprises, when the information data corresponds to the Mth data set, generating the codeword such that only parity bits corresponding to the Mth parity set among all the parity bits are updated.

11. The method of claim 8, wherein the generating of the codeword comprises when the information data corresponds to the (L+1)th data set, generating the codeword such that all the parity bits are updated.

12. The method of claim 2, wherein the generating of the codeword comprises:

generating the codeword by using a parity check matrix comprising a data region divided into (2L+1) data sets and a parity region divided into L parity sets, wherein L is an integer equal to or greater than 2, wherein:

each of first and second data sets of the (2L+1) data sets comprises at least one first zero matrix, a first parity set of the L parity sets comprises at least one second zero matrix, and locations of the at least one first and second zero matrixes in a row direction are the same.

13. The method of claim 1, wherein the first program unit is a page unit.

14. The method of claim 1, wherein the first program unit corresponds to a number of memory cells commonly connected to a same signal line in a memory cell array included in the nonvolatile memory device.

15. The method of claim 1, wherein the second program unit is a byte unit.

16. The method of claim 1, wherein the nonvolatile memory device is a resistive memory device.

17. A method of operating a memory system, the memory system including a nonvolatile memory device and a memory controller for the nonvolatile memory device, the method comprising:

the memory controller receiving information data corresponding to a second program unit that is a part of a first program unit and a write request for the information data from a host;

the memory controller generating a codeword by performing low density parity check (LDPC) encoding on the information data by using a parity check matrix;

the memory controller providing the nonvolatile memory device with the codeword and a write command regarding the codeword; and the nonvolatile memory device performing a write operation with respect to the codeword on cells corresponding to the updated partial parity bit and cells corresponding to the information data, wherein:

the parity check matrix comprises a data region divided into at least first through third data sets and a parity region divided into at least first and second mutually-exclusive parity sets, and when the information data corresponds to the first data set, only a parity bit corresponding to the first parity set is updated within the codeword, and when the information data corresponds to the second data set, only a parity bit corresponding to the second parity set is updated within the codeword.

18. The method of claim 17, wherein:
elements corresponding to lower $p_2$ rows of the first data set and the first parity set are 0,
elements corresponding to upper $p_1$ rows of the second data set and the second parity set are 0, and
$p_1$ and $p_2$ are integers greater than 0.

19. A method of operating a memory system, the memory system including a nonvolatile memory device and a memory controller for the nonvolatile memory device, the method comprising:
the memory controller receiving information data corresponding to a second program unit that is a part of a first program unit and a write request for the information data from a host;
the memory controller generating a codeword by performing low density parity check (LDPC) encoding on the information data by using a parity check matrix such that a partial parity bit corresponding to the information data among all parity bits of the codeword is updated;
the memory controller providing the nonvolatile memory device with the codeword and a write command regarding the codeword; and
the nonvolatile memory device writing the information data and the updated partial parity bit included in the codeword, but not all of the parity bits of the codeword, to a memory cell array included in the nonvolatile memory device.

20. The method of claim 19, wherein the nonvolatile memory device is a resistive memory device.

* * * * *